(12) United States Patent
Hino

(10) Patent No.: US 7,342,464 B2
(45) Date of Patent: Mar. 11, 2008

(54) OSCILLATOR AND A PLL CIRCUIT USING THE OSCILLATOR

(75) Inventor: Takuo Hino, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 50 days.

(21) Appl. No.: 11/431,754

(22) Filed: May 10, 2006

(65) Prior Publication Data

US 2006/0255872 A1 Nov. 16, 2006

(30) Foreign Application Priority Data

May 12, 2005 (JP) .............................. 2005-139749

(51) Int. Cl.
*H03B 5/08* (2006.01)
(52) U.S. Cl. ............................... 331/167; 331/117 FE; 331/117 R; 331/177 V; 331/108 C; 336/200
(58) Field of Classification Search ................ 331/167, 331/117 FE, 117 R, 177 V, 108 C; 336/200
See application file for complete search history.

(56) References Cited

U.S. PATENT DOCUMENTS 5,952,893 A * 9/1999 Ghoshal ................. 331/108 C

2004/0183606 A1 9/2004 Komurasaki et al.

FOREIGN PATENT DOCUMENTS

| JP | 2002-151953 | 5/2002 |
| JP | 2004-266718 | 9/2004 |

* cited by examiner

*Primary Examiner*—Arnold Kinkead
(74) *Attorney, Agent, or Firm*—RatnerPrestia

(57) ABSTRACT

The functionality and performance of a voltage-controlled oscillator are improved by enabling continuously adjusting an inductor by a control signal. The oscillator has a variable inductor unit with variable inductance; a variable capacitance device connected to the variable inductor unit; an output unit that oscillates at an oscillation frequency determined by the inductance of the variable inductor unit and the capacitance of the variable capacitance device; and a control signal generator for modulating the oscillation frequency. The variable inductor unit has a first inductor; a current signal generator for detecting an electric signal denoting current flowing to the first inductor, and generating a current signal based on the electric signal; and a second inductor that receives the current signal. The first inductor and second inductor are disposed to a predetermined magnetically coupled position, and the variable inductor unit sets the inductance of the first inductor desirably.

12 Claims, 20 Drawing Sheets

OSCILLATOR AND A PLL CIRCUIT USING THE OSCILLATOR

BACKGROUND OF THE INVENTION

1. Field of Technology

The present invention relates to technology for a voltage-controlled oscillator that is used in wireless communication devices having a portable terminal, and to a PLL circuit that uses the voltage-controlled oscillator.

2. Description of Related Art

A voltage-controlled oscillator (VCO) is used in portable wireless devices such as cell phones for frequency conversion operations converting transmission signals to high frequency signals for transmission and converting reception signals to low frequency signals for demodulation. These applications require a wide oscillation frequency range, the ability to freely adjust the oscillation frequency, and a high carrier-to-noise (C/N) ratio at the oscillation frequency.

Semiconductor devices used in the communications industry today often have an internal voltage-controlled oscillator. Spiral inductors are generally used when the inductor is also built in to the IC device. A wide oscillation frequency band is achieved in the built-in voltage-controlled oscillator by switching between spiral inductors.

An example of this type of conventional voltage-controlled oscillator is the oscillation circuit and inductance load difference circuit shown in FIG. 20 and taught in Japanese Unexamined Patent Appl. Pub. 2004-266718 corresponding to United States Patent Appl. Pub. US 2004/0183606 A1.

The oscillation circuit shown in FIG. 20 is composed of a differential inductance-capacitance resonance circuit and positive feedback circuit where the resonance circuit comprises capacitor C1 and an inductance load difference circuit comprising variable inductance units Lvar1 and Lvar2, and the positive feedback circuit comprises n-channel MOS transistors M1 and M2. The variable inductance units Lvar1 and Lvar2 each have first and second input/output (I/O) terminals with the second I/O terminals connected to a common external power supply node Vdd. The first I/O terminals are connected to output nodes OUT and OUTB, respectively. The capacitor C1 is also connected to the first I/O terminals of the variable inductance units Lvar1 and Lvar2. The oscillation frequency of the voltage-controlled oscillator can be determined from the inductance of the variable inductance unit and the capacitance.

The variable inductance units Lvar1 and Lvar2 vary the inductance and control the oscillation frequency by switching a plurality of switch circuits SW1, SW2, SW3, SW1d, SW2d, and SW3d disposed between a plurality of selected positions on the spiral wiring layer and the I/O terminals. The variable inductance units Lvar1 and Lvar2 form an inductor pair when switch SWndd of switch circuits SW1, SW2, SW3 connected between the first I/O terminals is ON at the same time as switch circuits SWn and SWnd.

See Japanese Unexamined Patent Appl. Pub. 2004-266718 corresponding to United States Patent Appl. Pub. US 2004/0183606 A1.

The variable inductance units taught in the patents cited above are composed of serial-parallel circuits comprising a plurality of inductors and a plurality of switch circuits, and changes the overall inductance in steps by turning the switch circuits on or off. As a result, the oscillation frequency of the voltage-controlled oscillator also changes in steps.

This arrangement enables increasing the bandwidth of the voltage-controlled oscillator to some degree but does not afford sufficiently fine-tuning the oscillation frequency because correcting for variation in the inductors built in to the IC device is deficient. The oscillation frequency band can also not be freely set, and correcting for the capacitance-voltage nonlinearity and temperature characteristic of a varactor diode is not possible.

The nonlinearity of the varactor diode also makes directly modulating the voltage-controlled oscillator difficult.

SUMMARY OF THE INVENTION

The present invention is directed to solving these problems, and an object of the invention is to improve the functionality and performance of a voltage-controlled oscillator and a PLL circuit that uses the voltage-controlled oscillator by enabling continuously controlling the inductor by a control signal.

To achieve this object, an oscillator according to a preferred aspect of the invention comprises: a variable inductor unit with variable inductance; a variable capacitance device connected to the variable inductor unit; an output unit that comprises one or more active elements, oscillates at an oscillation frequency determined by the inductance of the variable inductor unit and the capacitance of the variable capacitance device, and generates a VCO signal; and a control signal generator operable to generate a frequency control signal to modulate the oscillation frequency.

The variable inductor unit comprises a first inductor; a current signal generator operable to detect an electric signal denoting current flowing to the first inductor or the voltage at both ends of the first inductor, and to generate a current signal based on the electric signal; and a second inductor that receives the current signal. The first inductor and second inductor are disposed to a predetermined magnetically coupled position, and the variable inductor unit sets the inductance of the first inductor desirably. The current signal generator controls the amplitude of the current signal based on the frequency control signal.

A PLL circuit according to another aspect of the invention comprises an oscillator according to this invention, a phase generator operable to adjust the phase of the VCO signal, and a loop filter operable to filter output from the phase generator and to output a capacitance control signal. The oscillator controls the voltage at both ends of the variable capacitance device based on the capacitance control signal, and sets the capacitance of the variable capacitance device desirably.

An oscillator and PLL circuit according to the present invention can correct the capacitance characteristic, frequency band characteristic, and temperature characteristic of the oscillator, and thereby achieve a constant conversion gain Kv across a wide frequency band and temperature range, by inputting different control signals to the variable inductor unit having a continuously variable output function. As a result, the invention enables directly modulating the oscillation frequency of the oscillator based on the frequency control signal, and thus affords a high precision, direct modulation oscillator. A mixer circuit is thus unnecessary, and power consumption can be reduced during transmission.

The lockup time and C/N characteristic of the PLL incorporating this voltage-controlled oscillator are also constant to the oscillation frequency, and a stable oscillation characteristic can be achieved.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

Preferred embodiments of the present invention are described below with reference to the accompanying figures. The first embodiment below describes a voltage-controlled oscillator according to the present invention, and the second embodiment describes a PLL circuit according to the present invention.

Numeric values shown in the following embodiments are used by way of example only to describe the invention, and the invention is not limited to using these values.

First Embodiment

Figure 1:
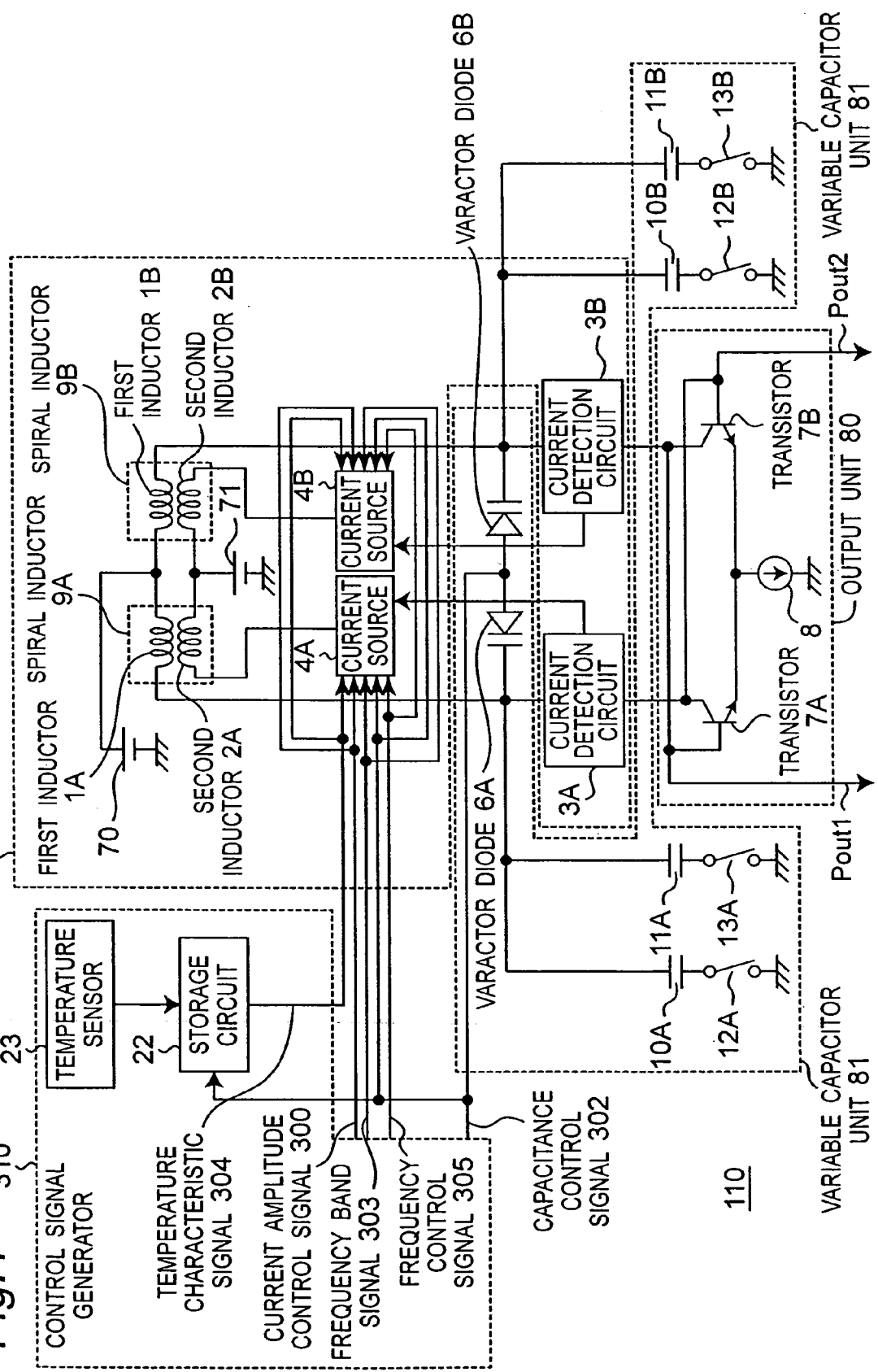
FIG. 1 is a block diagram of a voltage-controlled oscillator according to a first embodiment of the invention.

FIG. 1 is a block diagram of a voltage-controlled oscillator 110 according to a first embodiment of the invention.

As shown in FIG. 1, the voltage-controlled oscillator 110 comprises an output unit 80 having transistors 7A and 7B as active elements, a variable capacitor unit 81 comprising varactor diodes 6A and 6B as variable capacitance elements and fixed capacitors 10A, 11A, 10B, 11B, and a variable inductor unit 82 having spiral inductors 9A and 9B. The output unit 80 oscillates using the inductance-capacitance parallel resonance circuit comprising variable inductor unit 82 and variable capacitor unit 81 as the load.

In the output unit 80 the transistors 7A and 7B are connected with the base of one connected to the collector of the other, and the output signals Pout1 and Pout2 of the voltage-controlled oscillator 110 output from these two nodes. The emitters of transistors 7A and 7B go to ground through current source 8. This cross connection of the collectors and bases of the two transistors renders a positive feedback operation that oscillates at the resonance frequency of the inductance-capacitance parallel resonance circuit including the variable inductor unit 82 and variable capacitor unit 81.

Two transistors are used as the output unit 80 in this first embodiment of the invention, but the same effect can be achieved using two MOS transistors.

The anodes of the varactor diodes 6A and 6B in the variable capacitor unit 81 are connected to each other, and capacitance control signal 302 is input to this node. The cathodes of the varactor diodes 6A and 6B are connected to one end of first inductors 1A and 1B and to current detection circuits 3A and 3B, respectively. The voltage applied to both ends of the varactor diodes 6A and 6B varies according to the capacitance control signal 302, and the capacitance of the variable capacitor unit 81 is thus continuously variable.

Fixed capacitors 10A, 11A, and 10B, 11B are connected in parallel to varactor diodes 6A and 6B, and switches 12A, 13A and 12B, 13B are disposed in series to these fixed capacitors. Because the voltage-controlled oscillator 110 has a differential arrangement, the capacitance of fixed capacitors 10A, 11A and fixed capacitors 10B, 11B is the same, and switches 12A, 13A and switches 12B, 13B operate in conjunction with each other.

By appropriately switching fixed capacitors 10A, 11A, the capacitance can be varied in four steps.

Variable capacitance elements of which the capacitance can be controlled by the voltage of a varactor diode, for example, can be used instead of fixed capacitors 10A, 11A, 10B, 11B and switches 12A, 13A, 12B, 13B to switch the fixed capacitors.

The arrangement and operation of the variable inductor unit 82 are described next.

The current flowing through first inductors 1A and 1B also flows through current detection circuits 3A and 3B, and the frequency, phase, and current amplitude of these currents are detected by the current detection circuits 3A and 3B. The current sources 4A and 4B generate current signals of the same frequency, same phase, and current amplitude of a predetermined current-amplitude ratio K1 to the current detected by the current detection circuits 3A and 3B. The resulting current signals flow to second inductors 2A and 2B.

The value of the current-amplitude ratio K1 is positive, negative, or zero, and is constant relative to the current amplitude of the input current, but also varies according to the current amplitude control signal 300 input to both current sources 4A and 4B.

The first inductors 1A and 1B and second inductors 2A and 2B constituting spiral inductors 9A and 9B, respectively, are disposed to positions that are magnetically coupled by mutual induction. Depending on the sign of the current-amplitude ratio K1, the magnetic flux produced by the second inductors 2A and 2B works to increase or decrease the magnetic flux produced by the first inductors 1A and 1B. In this embodiment of the invention the second inductors 2A and 2B work to increase the magnetic flux from the first inductors 1A and 1B when current-amplitude ratio K1 is positive, and to decrease the magnetic flux of first inductors 1A and 1B when the current-amplitude ratio K1 is negative.

The amplitude of the current signals flowing through the second inductors 2A and 2B varies continuously according to the current amplitude control signal 300 input to the current sources 4A and 4B in the variable inductor unit 82 thus arranged. As a result, the current-amplitude ratio K1 of the current signal or the amplitude of the current signal flowing through the second inductors 2A and 2B can be continuously controlled by the current amplitude control signal 300. The apparent inductance of the first inductors 1A and 1B reflecting the mutual induction of the magnetic flux from the second inductors 2A and 2B on the magnetic flux produced by the first inductors 1A and 1B is the inductance of the variable inductor unit 82, and the inductance of the variable inductor unit 82 changes continuously and can be set as desired by the current amplitude control signal 300.

Furthermore, when current-amplitude ratio K1 is positive, the inductance of the variable inductor unit 82 increases and the resistance of the first inductors 1A and 1B does not change. As a result, the Q of the inductance of the variable inductor unit 82 increases compared with the first inductors 1A and 1B alone.

A frequency band signal 303 is also input to the current sources 4A and 4B. The current sources 4A and 4B can control the amplitude of the current signals or the current-amplitude ratio K1 of the current signals flowing to second inductors 2A and 2B continuously by the current amplitude control signal 300 and in steps by the frequency band signal 303. As a result, the inductance of the variable inductor unit 82 varies continuously according to the current amplitude control signal 300 and varies in steps according to the frequency band signal 303. The inductance of the variable inductor unit 82 can thus be set as desired.

The current amplitude control signal 300 and the frequency band signal 303 are generated by the control signal generator 310. The current amplitude control signal 300 and frequency band signal 303 are set automatically in the control signal generator 310 by an arrangement including the correction information generator 44 shown in FIG. 16. These signals can alternatively be manually set as desired by the operator, or preset to a constant factory setting prior to shipping. Note, further, that current detection circuit 3A and current source 4A together render one current signal generator, and current detection circuit 3B and current source 4B together render another current signal generator.

Figure 2:
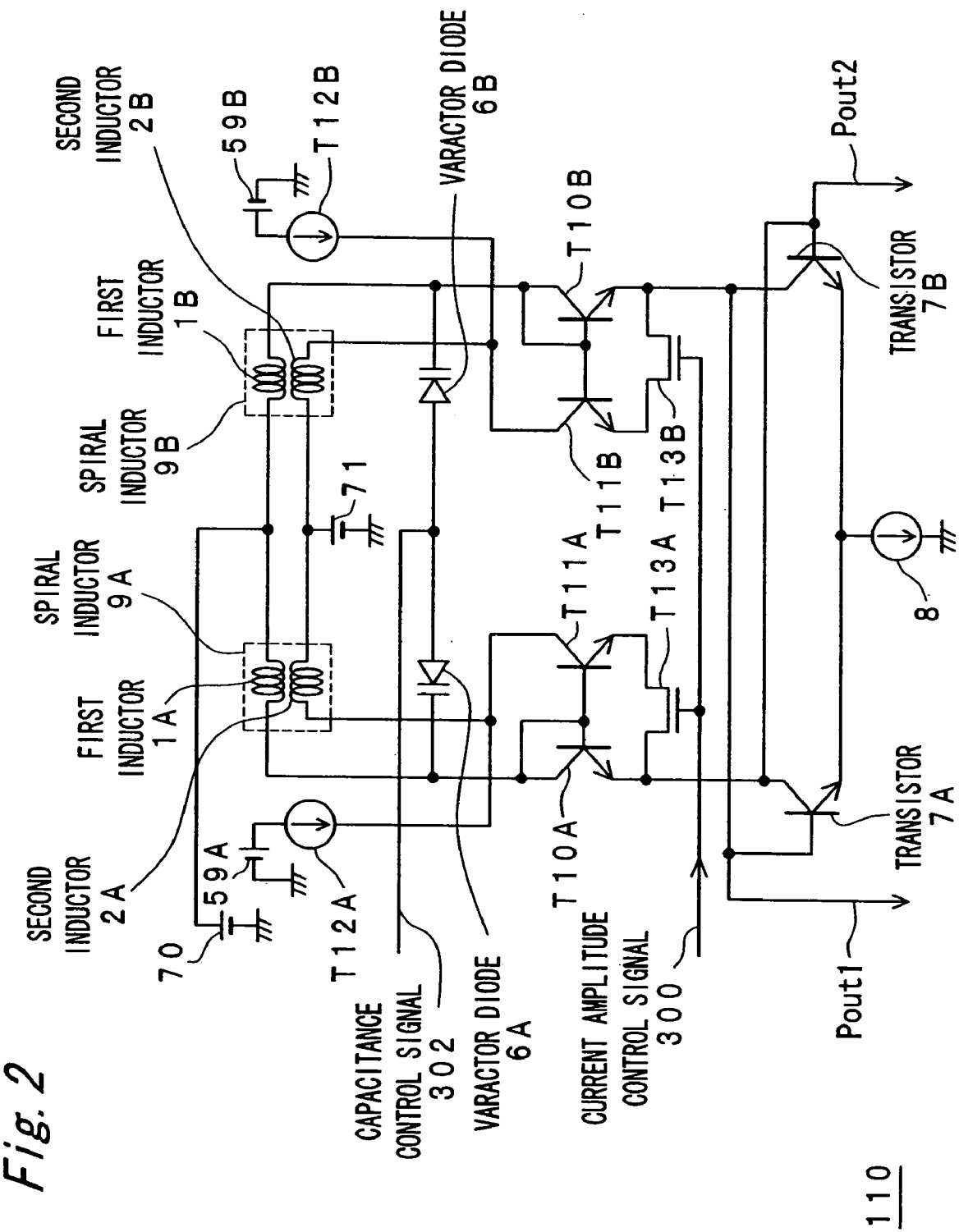
FIG. 2 is a partial circuit diagram of the voltage-controlled oscillator according to the first embodiment of the invention.

FIG. 2 is a partial circuit diagram of the voltage-controlled oscillator 110 according to the first embodiment of the invention. FIG. 2 shows specific examples of the current detection circuits 3A and 3B and current sources 4A and 4B, which are described in further detail below with reference to current detection circuit 3A and current source 4A.

As shown in FIG. 2, the current flowing through the first inductor 1A flows between the collector and emitter of transistor T10A. A current signal substantially proportional to the size ratio of transistor T11A to transistor T10A flows between the collector and emitter of the transistor T11A whereby a current mirror circuit is rendered with transistor T10A. The collector of transistor T11A is connected to second inductor 2A and to DC source 59A through current source T12A, and the current signal flowing to the transistor T11A also flows to second inductor 2A.

The gate voltage of MOS transistor T13A changes and the ON resistance between the drain and source of MOS transistor T13A changes continuously according to the current amplitude control signal 300. As a result, the current signal flowing to the second inductor 2 also changes continuously. The current-amplitude ratio K1 of the current signal or the amplitude of the current signal flowing through second inductor 2A can therefore be controlled continuously based on the current amplitude control signal 300.

The parts relating to the current detection circuit 3B and current source 4B can be described in the same way.

Major Parts of a First Variation of the First Embodiment

Figure 3:
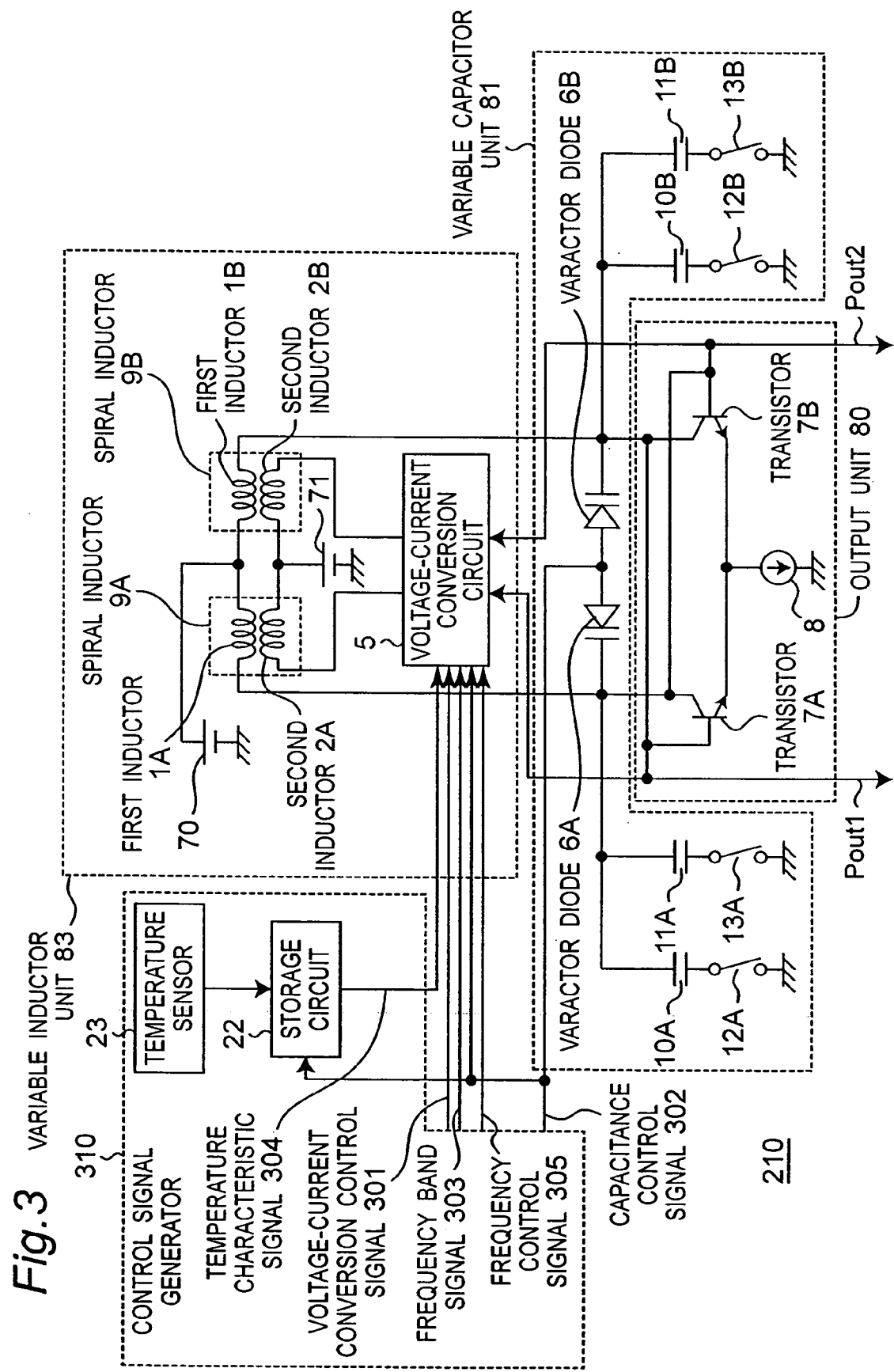
FIG. 3 is a block diagram of a voltage-controlled oscillator according to a first variation of the first embodiment of the invention.

FIG. 3 is a block diagram of the voltage-controlled oscillator 210 in a first variation of the first embodiment of the invention.

This voltage-controlled oscillator 210 comprises an output unit 80 composed of transistors 7A and 7B as active elements, a variable capacitor unit 81 comprising varactor diodes 6A and 6B as variable capacitance elements and fixed capacitors 10A, 11A, 10B, 11B, and a variable inductor unit 83 having spiral inductors 9A and 9B. The output unit 80 oscillates using the inductance-capacitance parallel resonance circuit comprising variable inductor unit 83 and variable capacitor unit 81 as the load.

The arrangement and operation of the output unit 80 and variable capacitor unit 81 are the same as described in the first embodiment.

The arrangement and operation of the variable inductor unit 83 are described next. The voltage applied to the ends of the first inductors 1A and 1B that are not connected to each other is also input to the voltage-current conversion circuit 5. The voltage-current conversion circuit 5 generates a current signal having a current amplitude of a predetermined voltage-current conversion ratio K2 and the same frequency as the input voltage, and this current signal flows to second inductors 2A and 2B. The value of the voltage-current conversion ratio K2 is positive, negative, or zero, and is constant relative to the voltage amplitude of the input voltage, but also depends on the voltage-current conversion control signal 301 input to the voltage-current conversion circuit 5.

The first inductor 1A and second inductor 2A constituting spiral inductor 9A, and the first inductor 1B and second inductor 2B constituting spiral inductor 9B, are disposed to positions that are magnetically coupled by mutual induction. Depending on the sign of the voltage-current conversion ratio K2, the magnetic flux produced by the second inductors 2A and 2B works to increase or decrease the magnetic flux produced by the first inductors 1A and 1B. In this embodiment of the invention the magnetic flux increases when voltage-current conversion ratio K2 is positive, and decreases when the voltage-current conversion ratio K2 is negative.

In the variable inductor unit 83 thus comprised, the amplitude of the current signals flowing to the second inductors 2A and 2B varies continuously according to the voltage-current conversion control signal 301 input to the voltage-current conversion circuit 5. As a result, the voltage-current conversion ratio K2 of the current signals or the amplitude of the current signals flowing to the second inductors 2A and 2B can be continuously controlled based on the voltage-current conversion control signal 301. The apparent inductance of the first inductors 1A and 1B reflecting the mutual induction of the magnetic flux from the second inductors 2A and 2B on the magnetic flux from the first inductors 1A and 1B is the inductance of the variable inductor unit 83, and varies continuously and can be set as desired by the voltage-current conversion control signal 301.

Furthermore, when voltage-current conversion ratio K2 is positive, the inductance of the variable inductor unit 83 increases and the resistance of the first inductors 1A and 1B does not change. As a result, the Q of the inductance of the variable inductor unit 83 increases compared with first inductors 1A and 1B alone.

Frequency band signal 303 is also input to the voltage-current conversion circuit 5. The voltage-current conversion circuit 5 varies the voltage-current conversion ratio K2 of the current signals or the amplitude of the current signals flowing to the second inductors 2A and 2B continuously according to the voltage-current conversion control signal 301 and in steps according to the frequency band signal 303. As a result, the inductance of the variable inductor unit 83 varies continuously according to the voltage-current conversion control signal 301 and in steps according to the frequency band signal 303. The inductance of the variable inductor unit 83 can thus be set as desired.

The voltage-current conversion control signal 301 and frequency band signal 303 are generated by the control signal generator 310. The voltage-current conversion control signal 301 and frequency band signal 303 are set automatically in the control signal generator 310 by an arrangement including the correction information generator 44 shown in FIG. 17 and further described below. These signals can alternatively be manually set as desired by the operator, or preset to a constant factory setting prior to shipping. Note, further, that the voltage-current conversion circuit 5 constitutes a current signal generator in the accompanying claims.

Figure 4:
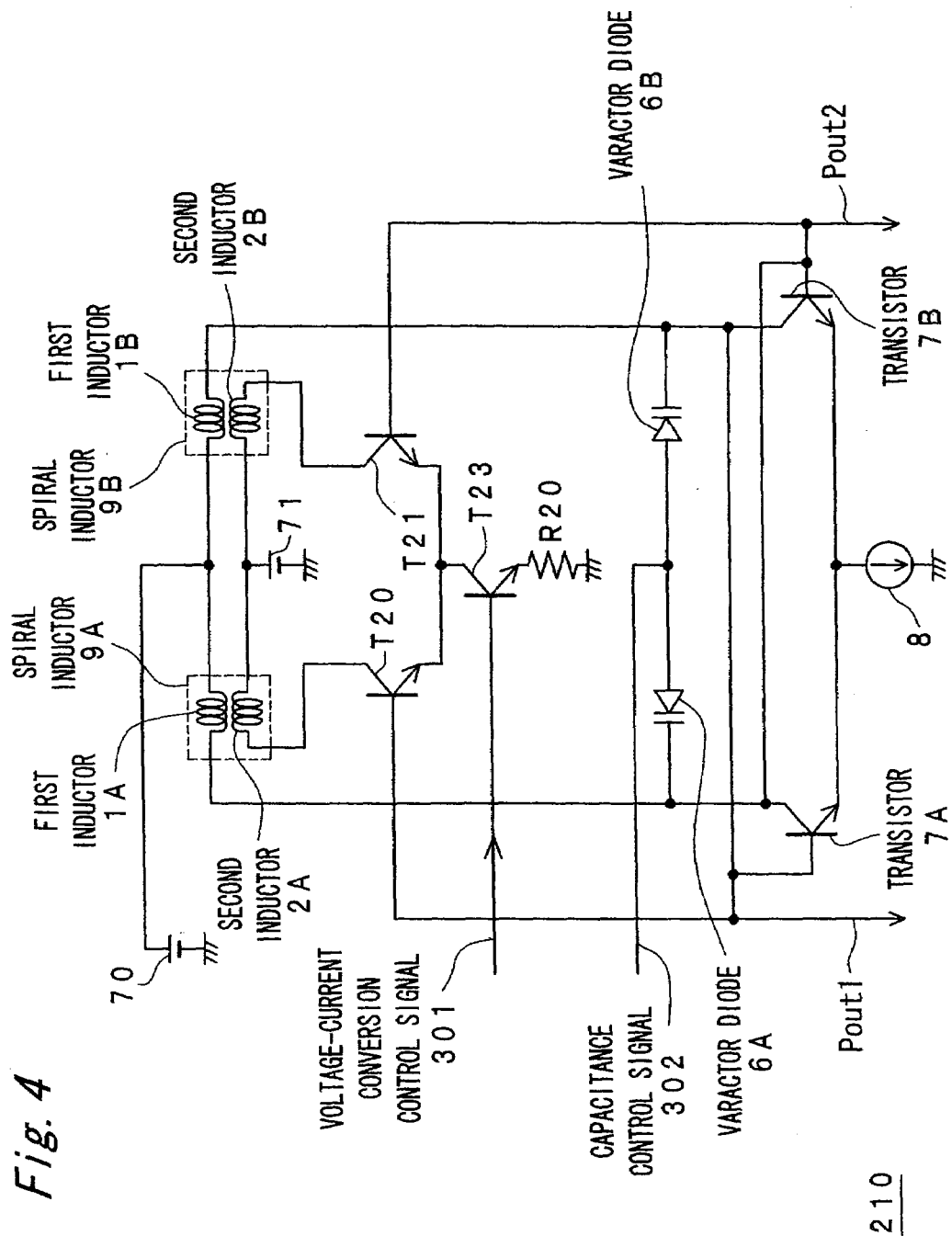
FIG. 4 is a circuit diagram of a voltage-controlled oscillator according to a third variation of the second embodiment of the invention.

FIG. 4 is a partial circuit diagram of the voltage-controlled oscillator in the first variation of the first embodiment of the invention. FIG. 4 shows a specific example of the voltage-current conversion circuit 5, which is described in further detail below.

The voltage applied to the ends of the first inductors 1A and 1B that are not connected to each other is also input to the base of transistor T20 and transistor T21, and a current signal proportional to the voltage is produced by the differential amplifier composed of transistor T20 and transistor T21 and is supplied to second inductors 2A and 2B.

The emitter of transistor T23 goes to ground through resistance R20, voltage-current conversion control signal 301 is applied to the base, and the collector current of the transistor T23 varies continuously according to the voltage-current conversion control signal 301. As a result, the current signal flowing to second inductors 2A and 2B is also continuously variable. The arrangement shown in FIG. 4 can therefore continuously control the voltage-current conversion ratio K2 of the current signal or the amplitude of the current signal flowing to the second inductors 2A and 2B based on the voltage-current conversion control signal 301.

Oscillation Frequency Characteristic in the First Embodiment

Factors affecting the oscillation frequency of the voltage-controlled oscillator are described below.

Figure 5:
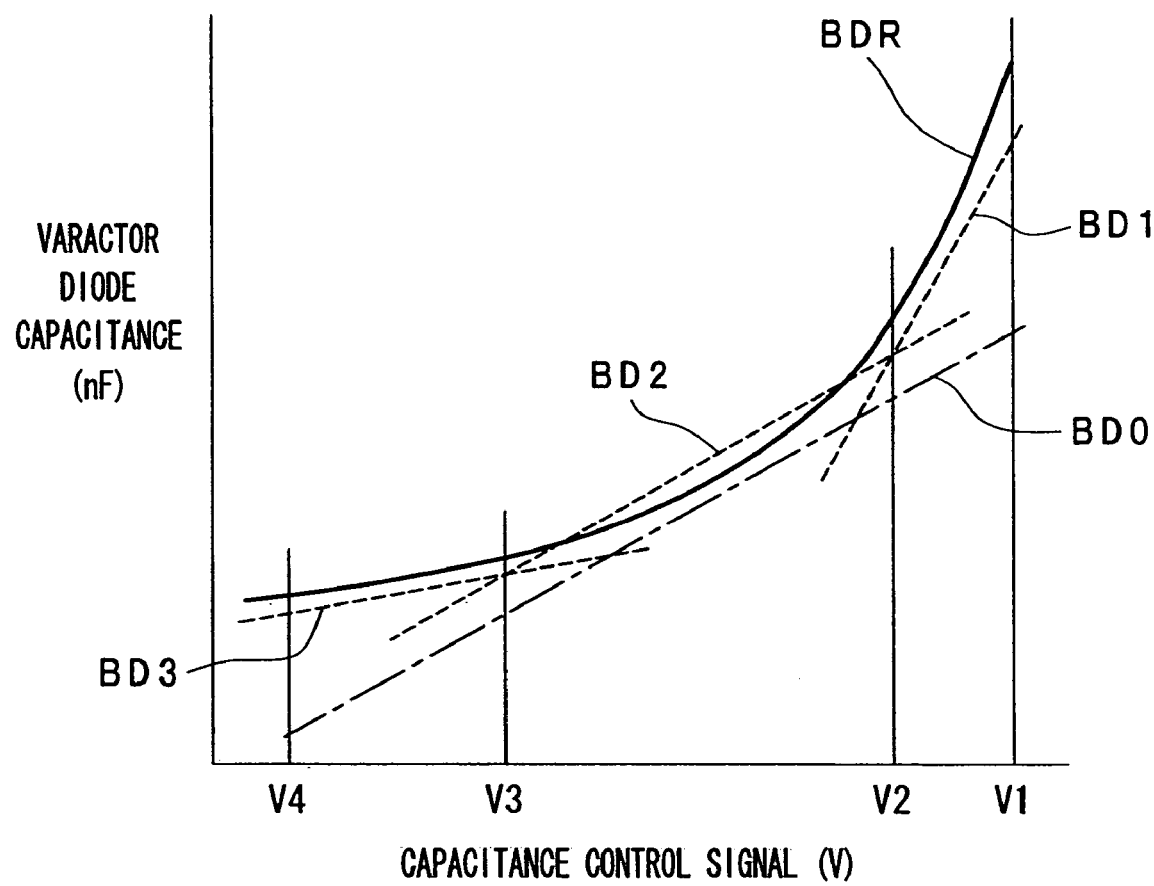
FIG. 5 shows the relationship between the capacitance of the varactor diode and the capacitance control signal.

FIG. 5 shows the relationship between the capacitance of the varactor diode and capacitance control signal 302. Because both cathodes of the varactor diodes 6A and 6B are connected to DC power source 70, the voltage applied to both ends of the varactor diodes 6A and 6B decreases as capacitance control signal 302 increases from V4 to V3, V2, V1. The capacitance characteristic representing the relationship between the capacitance of varactor diodes 6A and 6B and capacitance control signal 302 is ideally linear and rises to the right as denoted by dot-dash line BD0.

Figure 6:
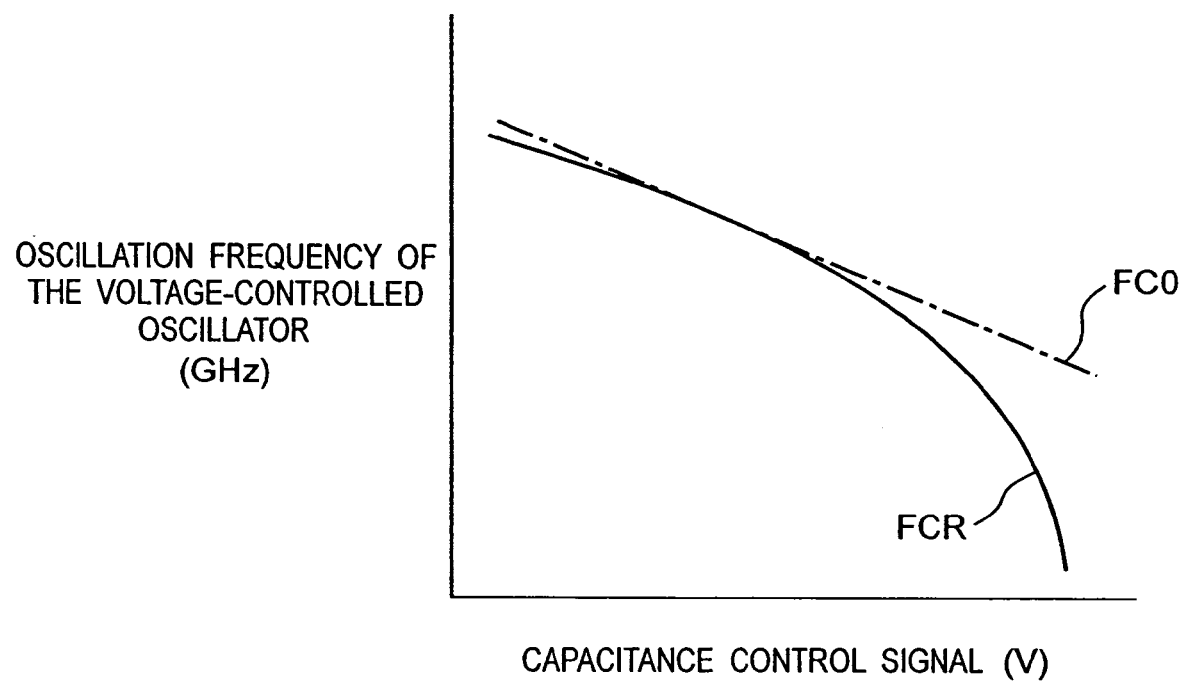
FIG. 6 shows the relationship between the oscillation frequency of the voltage-controlled oscillator and the capacitance control signal.

FIG. 6 schematically shows the relationship between the oscillation frequency of the voltage-controlled oscillator and capacitance control signal 302.

If half the inductance of the variable inductor unit is L and the capacitance of one of varactor diodes 6A and 6B is C, the ideal oscillation frequency fc of the differential operating voltage-controlled oscillator 110, 210 can be derived from equation (1).

$$fc = 1/(2\pi * \mathrm{sqrt}(L*C)) \quad (1)$$

If the capacitance of varactor diodes 6A and 6B varies linearly on a right-rising curve as denoted by BD0 in FIG. 5, the oscillation frequency of the voltage-controlled oscillator ideally decreases linearly to the right as denoted by FC0 in FIG. 6.

Figure 7:
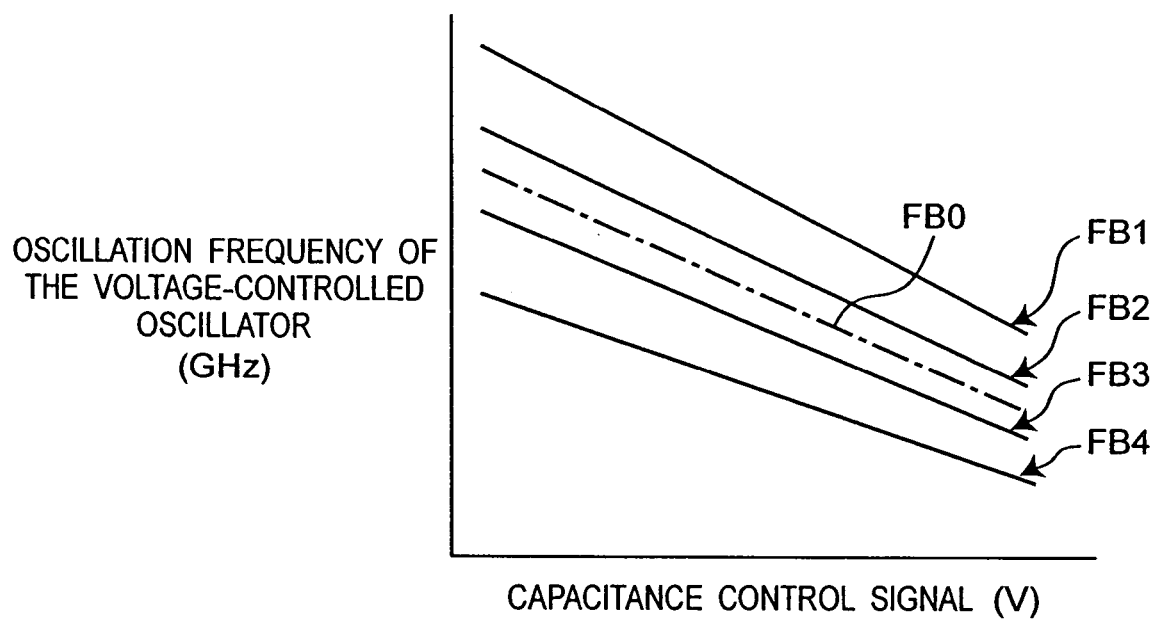
FIG. 7 shows the relationship between the capacitance control signal and the oscillation frequency using the frequency band signal is a parameter.

FIG. 7 schematically shows the relationship between the capacitance control signal 302 and the oscillation frequency of the voltage-controlled oscillator where the frequency band signal is a parameter. The ideal response corresponding to the ideal characteristic FC0 shown in FIG. 6 is line FB0, which represents the frequency band characteristic denoting the relationship when the frequency band signal is varied based on line FB0. If the inductance of the variable inductor unit is assumed to increase monotonically to frequency band signals FB1, FB2, FB3, FB4, four frequency bands can be rendered as shown in FIG. 7. As a result, the oscillation frequency band increases and operation can switch between a plurality of frequency bands, and the present invention can be applied in, for example, cell phones that use a plurality of frequency bands.

In practice, however, the capacitance of the varactor diode is nonlinear with respect to the capacitance control signal 302 as indicated by curve BDR in FIG. 5. As a result, the oscillation frequency of the voltage-controlled oscillator also varies nonlinearly to the capacitance control signal 302 as indicated by curve FCR in FIG. 6. The conversion gain Kv of the voltage-controlled oscillator is expressed as the degree of change in the oscillation frequency to the change in the capacitance control signal 302, but in this case varies dependently upon the value of the capacitance control signal 302. A PLL incorporating this voltage-controlled oscillator will exhibit an unstable lockup time and C/N characteristic depending on the oscillation frequency.

Solving the Nonlinearity of the Oscillation Frequency Characteristic

To solve this problem, the nonlinearity induced by the varactor diode as denoted by curve FCR in FIG. 6 is corrected by the variable inductance function of the variable inductor unit. The temperature characteristic of the varactor diode and fixed capacitor is also corrected in the same way.

If VT (unit=volts) denotes the level of the capacitance control signal, FB is the number of the frequency band signal, and TM (unit=degrees) is temperature, the actual oscillation frequency fc1 can be derived from equation (2) as compares with the ideal oscillation frequency fc shown in equation (1).

$$fc1=1/(2\pi*\mathrm{sqrt}(L*A1(VT)*A2(FB)*A3(TM)*C)) \quad (2)$$

A1(VT), A2(FB), and A3(TM) are nonlinear functions that are uniquely determined by VT, FB, and TM, and represent the offset from the ideal capacitance, frequency band, and temperature characteristics. Capacitance C denotes the capacitance of the varactor diode or fixed capacitor, is offset from the ideal characteristic by nonlinearity and the temperature characteristic, and is (A1(VT)*A2(FB)*A3(TM))*C. In this case, the ideal oscillation frequency fc can be achieved as shown in equation (1) by changing the half inductance L of the variable inductor unit to L/(A1(VT)*A2(FB)*A3(TM)) as shown in equation (3).

$$fc=1/(2\pi*\mathrm{sqrt}(L/(A1(VT)*A2(FB)*A3(TM))*(A1(VT)*A2(FB)*A3(TM))*C)) \quad (3)$$

If the actual capacitance characteristic BDR shown in FIG. 5 is divided into three parts, the capacitance characteristic will be approximated by line BD1 of slope B1 when the capacitance control signal VT is in the range from V1 to V2, by line BD2 of slope B2 when VT is in the range from V2 to V3, and line BD3 of slope B3 when VT is in the range from V3 to V4. If B0 is the slope of the ideal characteristic BD0, the correction coefficient for the capacitance characteristic is defined by equations (4), (5), and (6).

$$A1(VT)=B0/B1(V2 \leq VT \leq V1) \quad (4)$$

$$A1(VT)=B0/B2(V3 \leq VT \leq V2) \quad (5)$$

$$A1(VT)=B0/B3(V4 \leq VT \leq V3) \quad (6)$$

Linear approximation is used for correction coefficient A1(VT) here, but a quadratic approximation or table based on the actual curve could be used.

The correction coefficient for the frequency band characteristic is as shown in equations (7), (8), and (9) where B1 is the slope of the line when the frequency band signal FB is FB1 in FIG. 7, B2 is the slope when frequency band signal FB is FB2, B3 is the slope when frequency band signal FB is FB3, and B0 is the slope for the ideal characteristic FB0.

$$A2(FB1)=B0/B1 \quad (7)$$

$$A2(FB2)=B0/B2 \quad (8)$$

$$A2(FB3)=B0/B3 \quad (9)$$

The temperature characteristic is described next.

Figure 8:
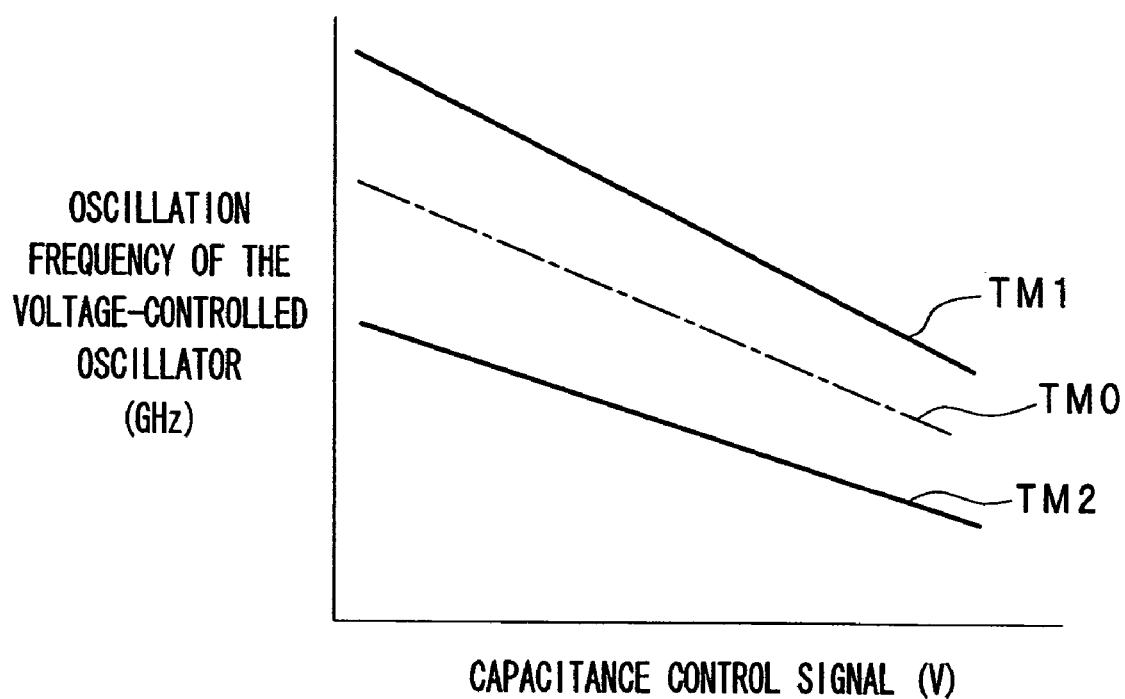
FIG. 8 shows the relationship between the oscillation frequency and capacitance control signal using temperature as a parameter.

FIG. 8 schematically shows the relationship between the oscillation frequency of the voltage-controlled oscillator and capacitance control signal 302 using temperature as a parameter. The ideal temperature characteristic corresponding to ideal characteristic FC0 in FIG. 6 is line TM0 representing the values at a normal temperature of 25 degC. TM1 corresponds to a high temperature of 100 degC., and TM2 to a low temperature of −40 degC.

If B1 is the slope when temperature TM is TM1, B2 is slope when TM is TM2, and B0 is the slope of the ideal characteristic TM0, the temperature characteristic correction coefficient is as shown in equations (10) and (11).

$$A3(TM1)=B0/B1 \quad (10)$$

$$A3(TM2)=B0/B2 \quad (11)$$

This temperature characteristic correction is applied not only to the varactor diode, but also the fixed capacitors 10A, 11A, 10B, 11B shown in FIG. 1 and FIG. 3.

By correcting the half inductance L of the variable inductor unit to L/(A1(VT)*A2(FB)*A3(TM)) by the control signals, the nonlinearity of the varactor diode and the temperature characteristic of the varactor diode and fixed capacitors can be corrected to the ideal characteristic. Because the conversion gain Kv of the voltage-controlled oscillator is constant regardless of capacitance control signal 302, the lockup time and C/N characteristic of a PLL incorporating the voltage-controlled oscillator are constant to the oscillation frequency, and a stable oscillation characteristic can be achieved.

Control Signal Generator 310 in the First Embodiment and First Variation of the First Embodiment The current amplitude control signal 300, voltage-current conversion control signal 301, and frequency band signal 303 input as control signals from the control signal generator 310 to the current sources 4A and 4B in FIG. 1 and the voltage-current conversion circuit 5 in FIG. 3 are described above. Another control signal and the control signal generator 310 therefore are described below.

The actual capacitance characteristic BDR can be reflected in the inductance correction by storing the capacitance characteristics of the varactor diodes 6A and 6B to the capacitance control signal 302 as shown in FIG. 5 in a storage circuit and reading data from the storage circuit according to the capacitance control signal 302.

The ideal oscillation frequency characteristic can be achieved by multiplying the inductance of the variable inductor unit 82, 83 by 1/(A1(VT)*A2(FB)) by capacitance control signal 302 and frequency band signal 303.

Figure 12:
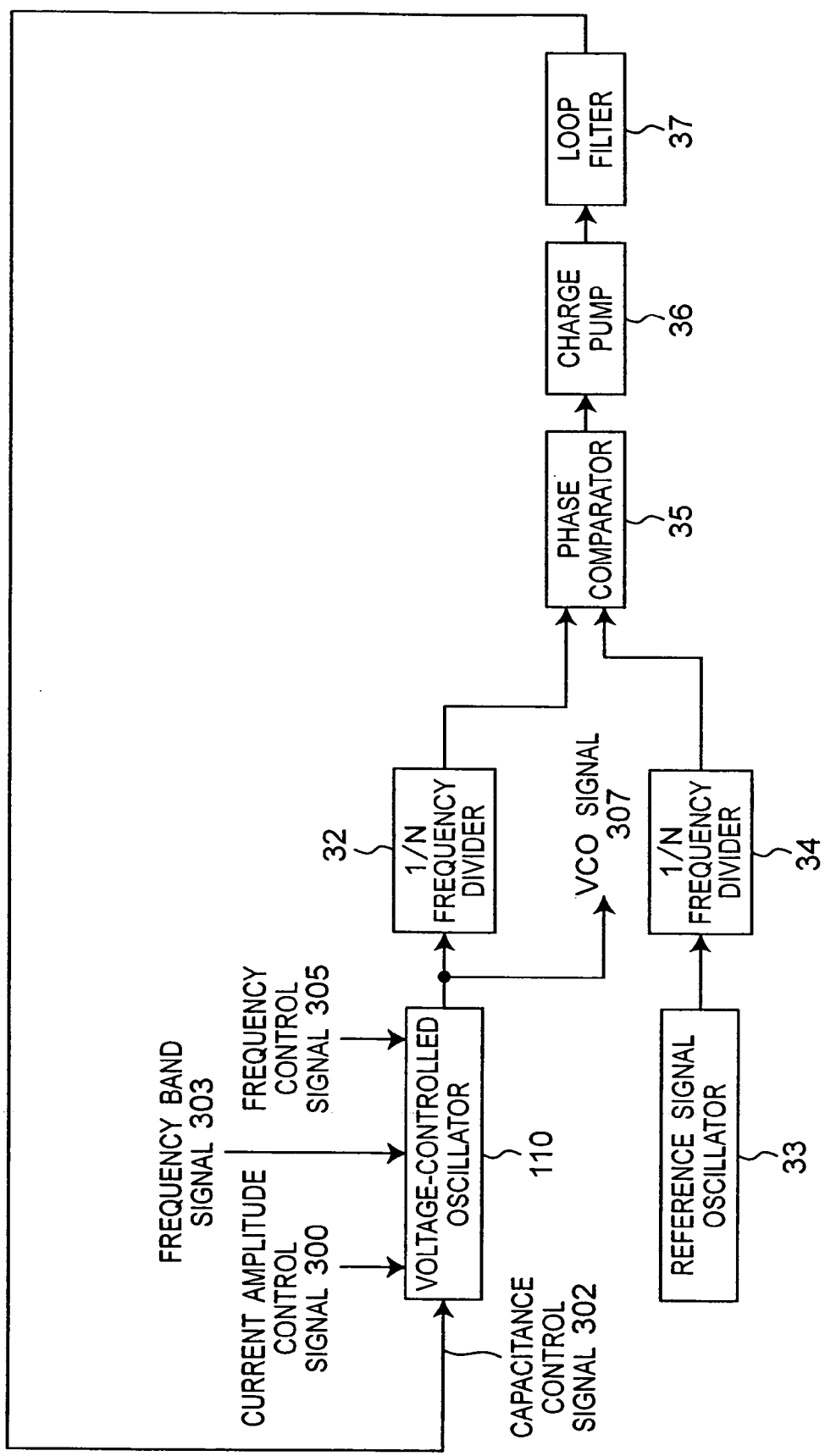
FIG. 12 is a block diagram of a PLL circuit according to a second embodiment of the invention.
Figure 13:
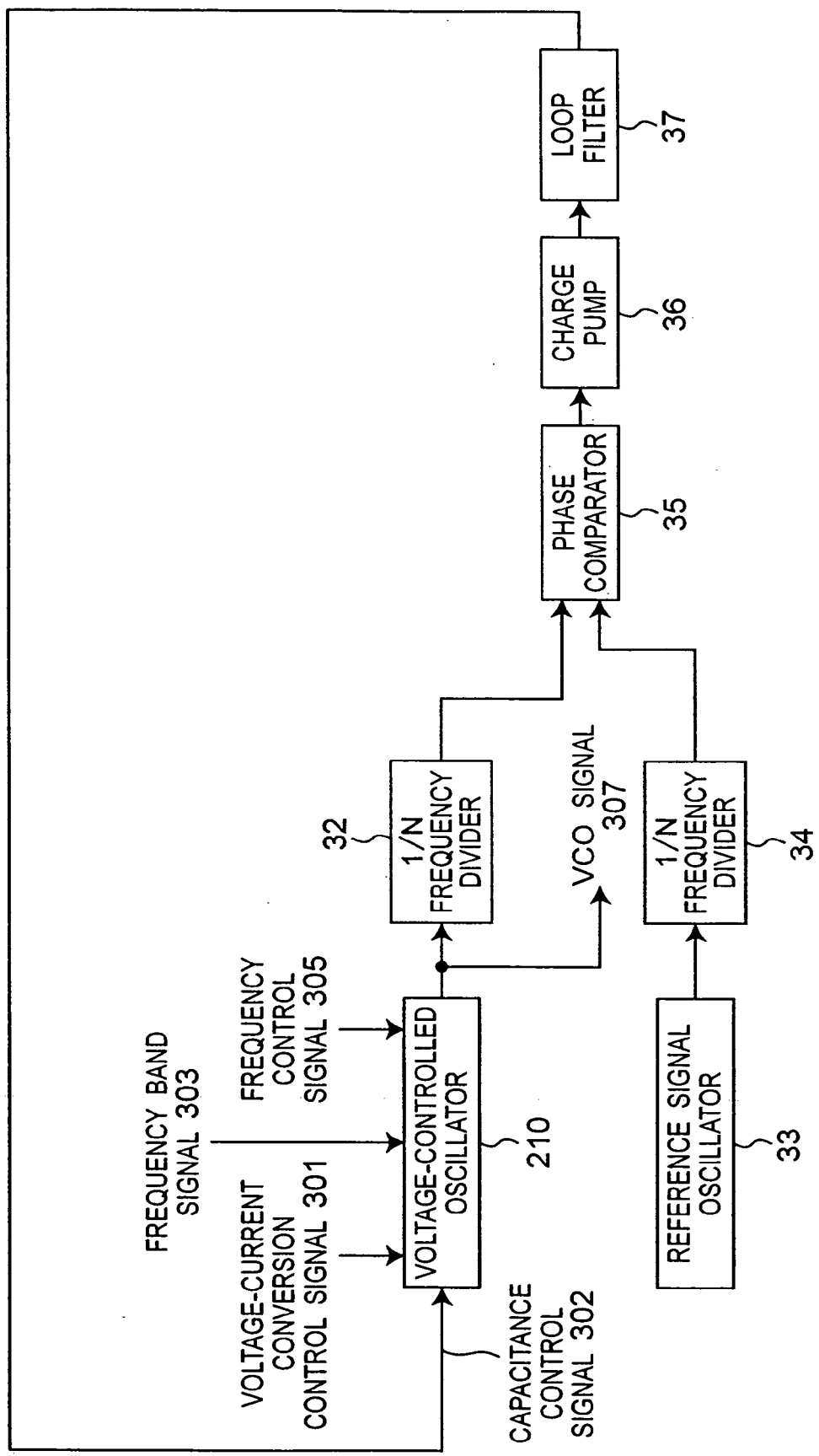
FIG. 13 is a block diagram of a PLL circuit according to a first variation of the second embodiment of the invention.

The capacitance control signal 302 is generated by the control signal generator 310. The control signal generator 310 sets the capacitance control signal 302 automatically by an arrangement comprising a loop filter 37 such as shown in FIG. 12 and FIG. 13 and described below. These signals can alternatively be manually set as desired by the operator, or preset to a constant factory setting prior to shipping.

The temperature characteristic signal 304 is generated by an arrangement including a temperature sensor 23 and storage circuit 22. The temperature sensor 23 detects the temperature of at least one of the varactor diodes 6A and 6B and fixed capacitors 10A, 11A, 10B, 11B, and inputs the detected temperature to the storage circuit 22, which stores the previously measured temperature characteristic.

The capacitance control signal 302 is also input to the storage circuit 22, and the change in capacitance at the detected temperature and capacitance control signal 302 level is generated as temperature characteristic signal 304 based on the input from the temperature sensor 23 and the capacitance control signal 302.

The ideal oscillation frequency characteristic can thus be acquired using capacitance control signal 302, frequency band signal 303, and temperature characteristic signal 304 by multiplying the inductance of the variable inductor unit 82 by 1/(A1(VT)*A2(FB)*A3(TM)).

The temperature sensor 23 and storage circuit 22 are part of the control signal generator 310, and the temperature characteristic signal 304 is generated by the control signal generator 310. The temperature characteristic signal 304 is set in this aspect of the invention by the control signal generator 310, but can alternatively be manually set as desired by the operator, or preset to a constant factory setting prior to shipping.

The voltage-controlled oscillator 110 or 210 can be directly modulated by inputting the frequency control signal 305 directly to current sources 4A and 4B or voltage-current conversion circuit 5, respectively. More specifically, like the current amplitude control signal 300 or voltage-current conversion control signal 301, the frequency control signal 305 is input to the gate of transistor T13A and transistor T13B in FIG. 2 or the base of transistor T23 in FIG. 4, causing the inductance of variable inductor unit 82 or 83 to vary according to the frequency control signal 305. The oscillation frequency can thus be directly modulated according to the frequency control signal 305, and a direct-modulation oscillator can be provided.

A mixer circuit is thus unnecessary, and power consumption can be reduced during transmission.

The frequency control signal 305 is generated by the control signal generator 310. In the control signal generator 310 the frequency control signal 305 is, for example, a cell phone baseband signal, and is a packetized signal containing headers and error correction parity added to compressed video or audio information. Specific examples of a control signal generator 310 therefore include error correction coding devices and packetizing devices.

Figure 9:
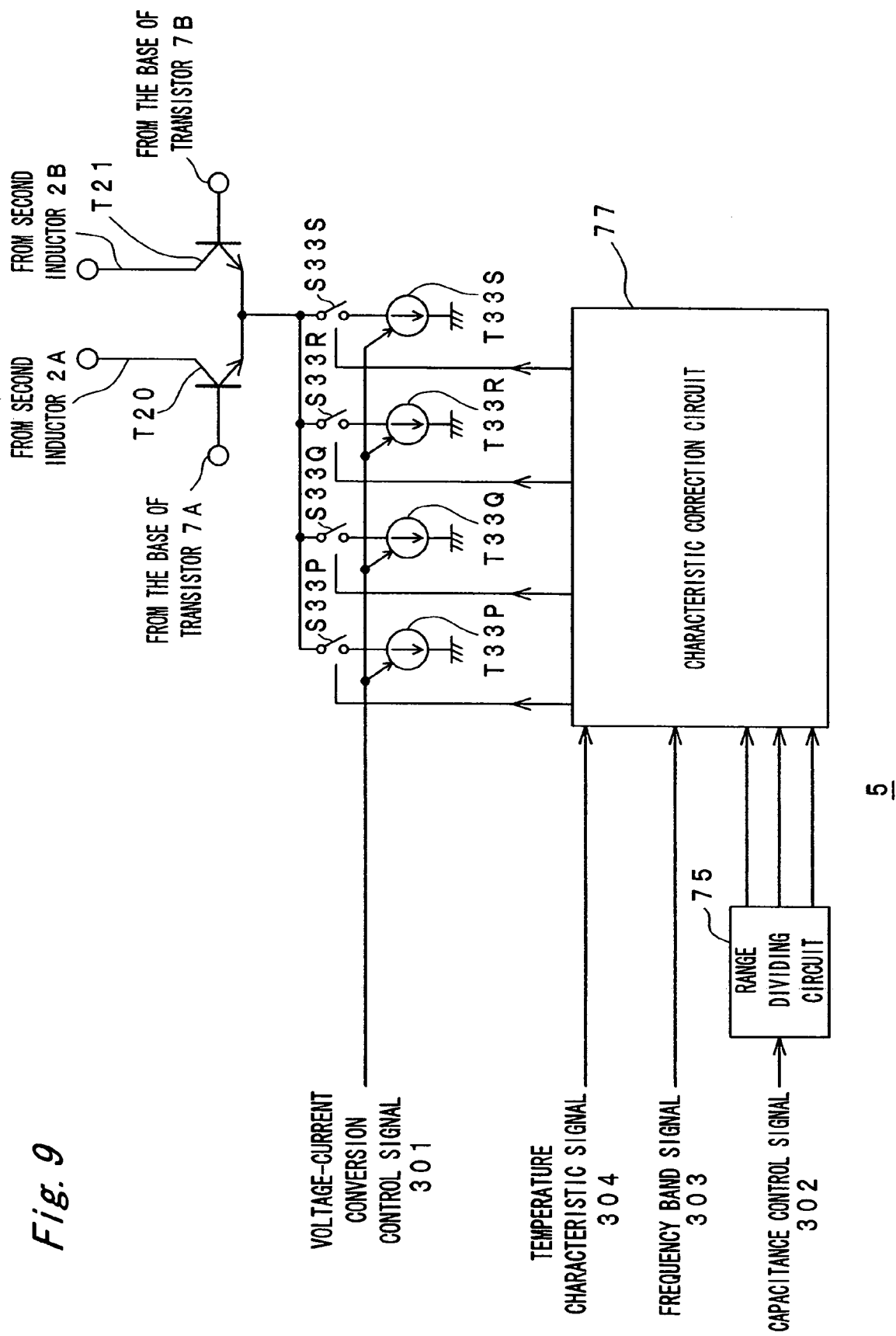
FIG. 9 is a circuit diagram of the voltage-current conversion circuit in a first variation of the first embodiment of the invention.

Circuit Diagram for the Voltage-Current Conversion Circuit 5 in a First Variation of the First Embodiment FIG. 9 is a circuit diagram of the voltage-current conversion circuit 5 in a first variation of the first embodiment.

As with the arrangement shown in FIG. 4, the bases of transistor T20 and transistor T21 in a differential arrangement are connected to the bases of transistors 7A and 7B, respectively, and the collectors are respectively connected to one side of second inductors 2A and 2B. A current supply source is connected to the emitters of transistors T20 and T21. These four current supply sources are switched by the control signal.

The capacitance control signal 302 is divided by range dividing circuit 75 into three bands from V1 to V2, V2 to V3, and V3 to V4 as shown in FIG. 5, and is input as three signals, one of which is HIGH, to the characteristic correction circuit 77. Based on the signals from the range dividing circuit 75, the frequency band signal 303, and the temperature characteristic signal 304, the characteristic correction circuit 77 calculates correction coefficient 1/(A1(VT)*A2(FB)*A3(TM)) and outputs four control signals controlling switches S33P, S33Q, S33R, S33S.

The four current supply sources T33P, T33Q, T33R, T33S have a weighted current setting, and set the voltage-current conversion ratio K2 according to the current level. By appropriately switching these four current supply sources, the inductance of the variable inductor unit 83 is corrected to the inductance times 1/(A1(VT)*A2(FB)*A3(TM)). At least one of switches S33P, S33Q, S33R, S33S is ON, and a plurality of these switches could be ON. By thus switching four current supply sources, the inductance can be precisely corrected in fifteen steps.

The voltage-current conversion control signal 301 is used for precisely adjusting the four current supply sources or for correcting another parameter.

Second and Third Variations of the First Embodiment

Figure 10:
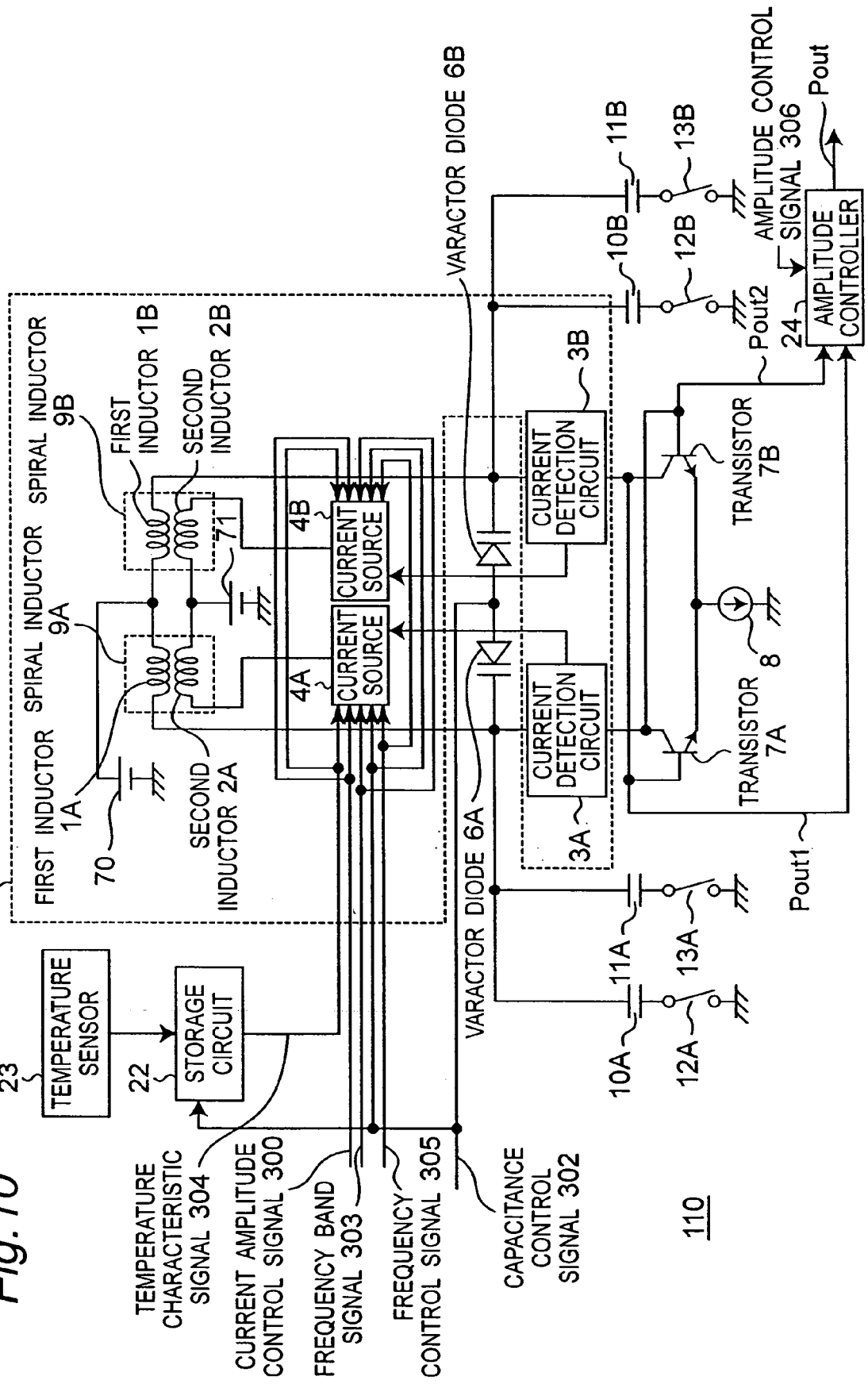
FIG. 10 is a block diagram of a voltage-controlled oscillator according to a second variation of the first embodiment.

FIG. 10 is a block diagram of a voltage-controlled oscillator 110 according to a second variation of the first embodiment.

This voltage-controlled oscillator 110 differs from the voltage-controlled oscillator 110 shown in FIG. 1 in that the output unit 80 comprises an amplitude controller 24 for controlling signal amplitude. Signals Pout1 and Pout2 are input to the amplitude controller 24, which modulates the amplitude based on the amplitude control signal 306 and outputs the result as signal Pout. Because signals Pout1 and Pout2 are frequency modulated based on frequency control signal 305, and the signal amplitude is then modulated based on the amplitude control signal 306, this aspect of the invention can generate a modulated signal such as QAM carrying both phase and amplitude information.

Figure 11:
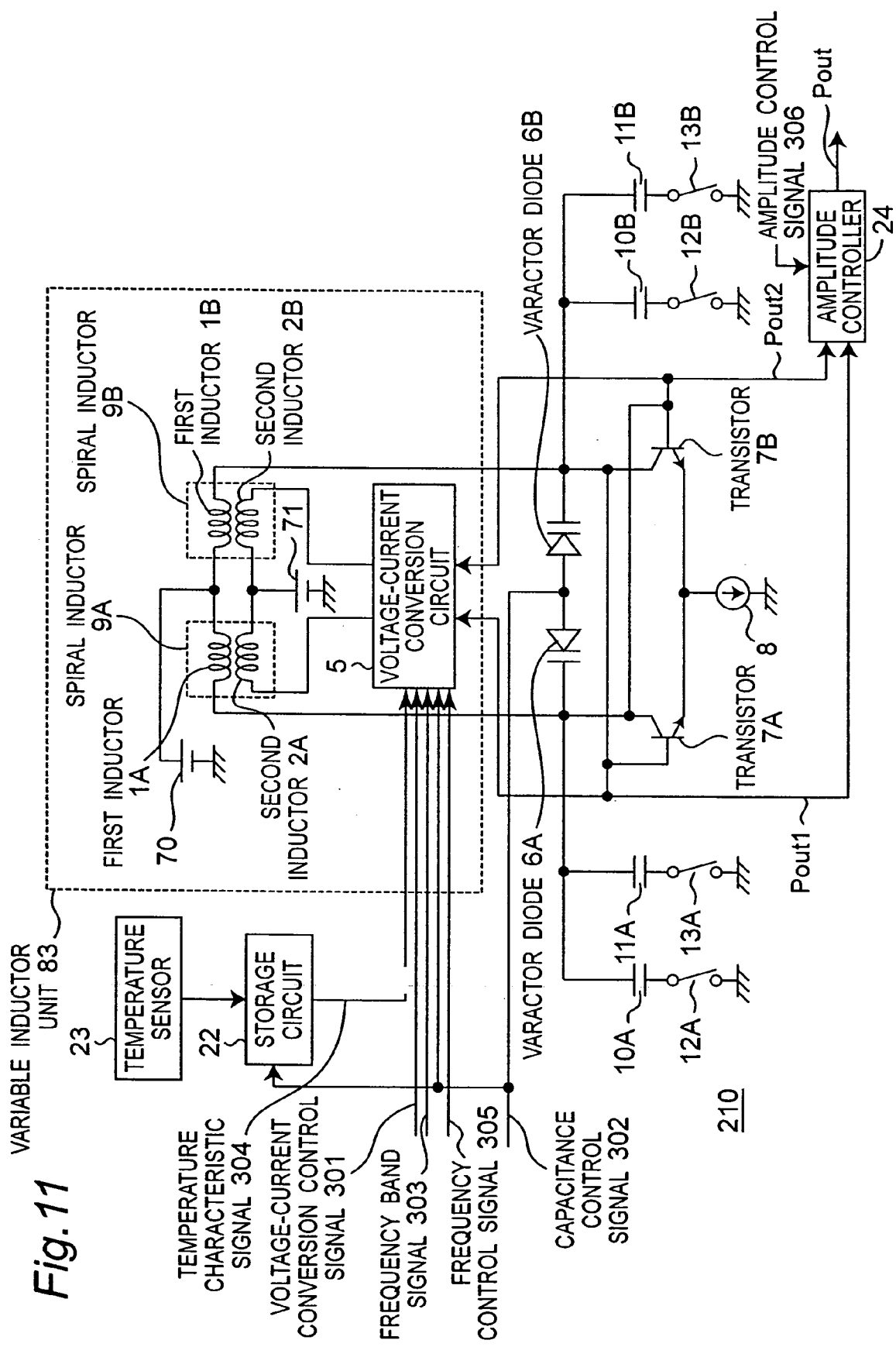
FIG. 11 is a block diagram of a voltage-controlled oscillator according to a third variation of the first embodiment.

FIG. 11 is a block diagram of a voltage-controlled oscillator 210 according to a third variation of the first embodiment.

This voltage-controlled oscillator 110 differs from the voltage-controlled oscillator 110 shown in FIG. 3 in that the output unit 80 comprises an amplitude controller 24 for controlling signal amplitude. Signals Pout1 and Pout2 are input to the amplitude controller 24, which modulates the amplitude based on the amplitude control signal 306 and outputs the result as signal Pout. Because signals Pout1 and Pout2 are frequency modulated based on frequency control signal 305, and the signal amplitude is then modulated based on the amplitude control signal 306, this aspect of the invention can generate a modulated signal such as QAM carrying both phase and amplitude information.

Fourth Variation of the First Embodiment

In the voltage-controlled oscillators 110 and 210 according to the first embodiment and the first to third variations of the first embodiment the inductance of the variable inductor unit 82, 83 varies according to the current signal flowing from the second inductors 2A and 2B, and the Q of the variable inductor unit 82, 83 thus also varies. As a result, the optimum resonance frequency flowing to the first inductors 1A and 1B varies with the change in Q.

In order to optimize the resonance frequency flowing to the first inductors 1A and 1B, the amplitude of the current signal flowing to the second inductors 2A and 2B is detected by a current signal detector, and the current flow to the current source 8 is varied according to the amplitude of the current signal. The relationship between the amplitude of the current signal flowing to the second inductors 2A and 2B and the optimum current flow to the current source 8 is predetermined and stored in the storage circuit, and is referenced when adjusting the current flow to the current source 8.

Effect of the First Embodiment

Various problems with the voltage-controlled oscillator 110, 210 can be solved by inputting various control signals to a variable inductor unit 82, 83 with a continuously variable output function.

First, the inductance of the variable inductor unit 82, 83 can be varied continuously by applying current amplitude control signal 300 and voltage-current conversion control signal 301, respectively, and can be varied in steps by applying frequency band signal 303. As a result, the voltage-controlled oscillator 110, 210 has a frequency band selection function and can select any desired frequency within the selected frequency band.

In addition, the current amplitude control signal 300 and voltage-current conversion control signal 301 enable accurately and precisely adjusting the oscillation frequency, and can thus reduce manufacturing variation in the voltage-controlled oscillator 110, 210 to a negligible level that poses no problem in practical operation.

The nonlinearity of the varactor diodes 6A and 6B can also be corrected by inputting the capacitance control signal 302 to the variable inductor unit 82, 83. By also considering the frequency band signal 303, nonlinearity can be corrected across a wide frequency band. As a result, the conversion gain Kv of the voltage-controlled oscillator 110, 210 is constant irrespective of the capacitance control signal 302 and frequency band signal 303. As a result, the lockup time and C/N characteristic of the PLL incorporating this voltage-controlled oscillator 110, 210 are constant relative to the oscillation frequency, thus affording a stable oscillation characteristic.

Yet further, the capacitance control signal 302 and temperature characteristic signal 304 enable correcting change in the temperature characteristic according to the voltage at both ends of the varactor diode, and correcting the temperature characteristic of the fixed capacitors. A stable oscillation characteristic can thus be achieved over a wide temperature range.

Because the oscillation frequency characteristic of the voltage-controlled oscillator 110, 210 is thus linear over a wide frequency range, the oscillation frequency of the voltage-controlled oscillator 110, 210 can be directly modulated using the frequency control signal 305. As a result, the invention enables directly modulating the oscillation frequency of the oscillator based on the frequency control signal, and thus affords a high precision, direct modulation oscillator. A mixer circuit is thus unnecessary, and power consumption can be reduced during transmission.

Another effect of this aspect of the invention is that because the Q of the variable inductor unit 82, 83 can be increased, the C/N ratio of the oscillation frequency of the voltage-controlled oscillator 110, 210 can also be improved.

In addition, by also using a function for varying the capacitance using a varactor diode and variable inductor unit 82, 83, the oscillation frequency can be changed without greatly varying the inductance to capacitance ratio. As a result, the oscillation frequency band is increased and a stable oscillation characteristic is achieved over a broad frequency range.

Second Embodiment

A PLL circuit according to a second embodiment of the invention is described next.

FIG. 12 is a block diagram of a PLL circuit according to this second embodiment of the invention.

The voltage-controlled oscillator 110 generates and outputs VCO signal 307, which is also 1/N frequency divided by 1/N frequency divider 32. The output of the reference signal oscillator 33 is 1/R frequency divided by 1/R frequency divider 34. The phase comparator 35 then compares the outputs from 1/N frequency divider 32 and 1/R frequency divider 34, and outputs the phase difference of the advance or delay in the input signals as the phase signal. Based on the sign of this phase difference, the charge pump 36 converts the phase signal to a positive or negative current. The loop filter 37 then converts the integral of this current to voltage, and removes high frequency distortion and noise. The output of loop filter 37 is input as capacitance control signal 302 to voltage-controlled oscillator 110, which generates the VCO signal 307 at an oscillation frequency determined by the capacitance control signal 302.

The phase comparator 35 is also referred to a phase generator herein.

Figure 18:
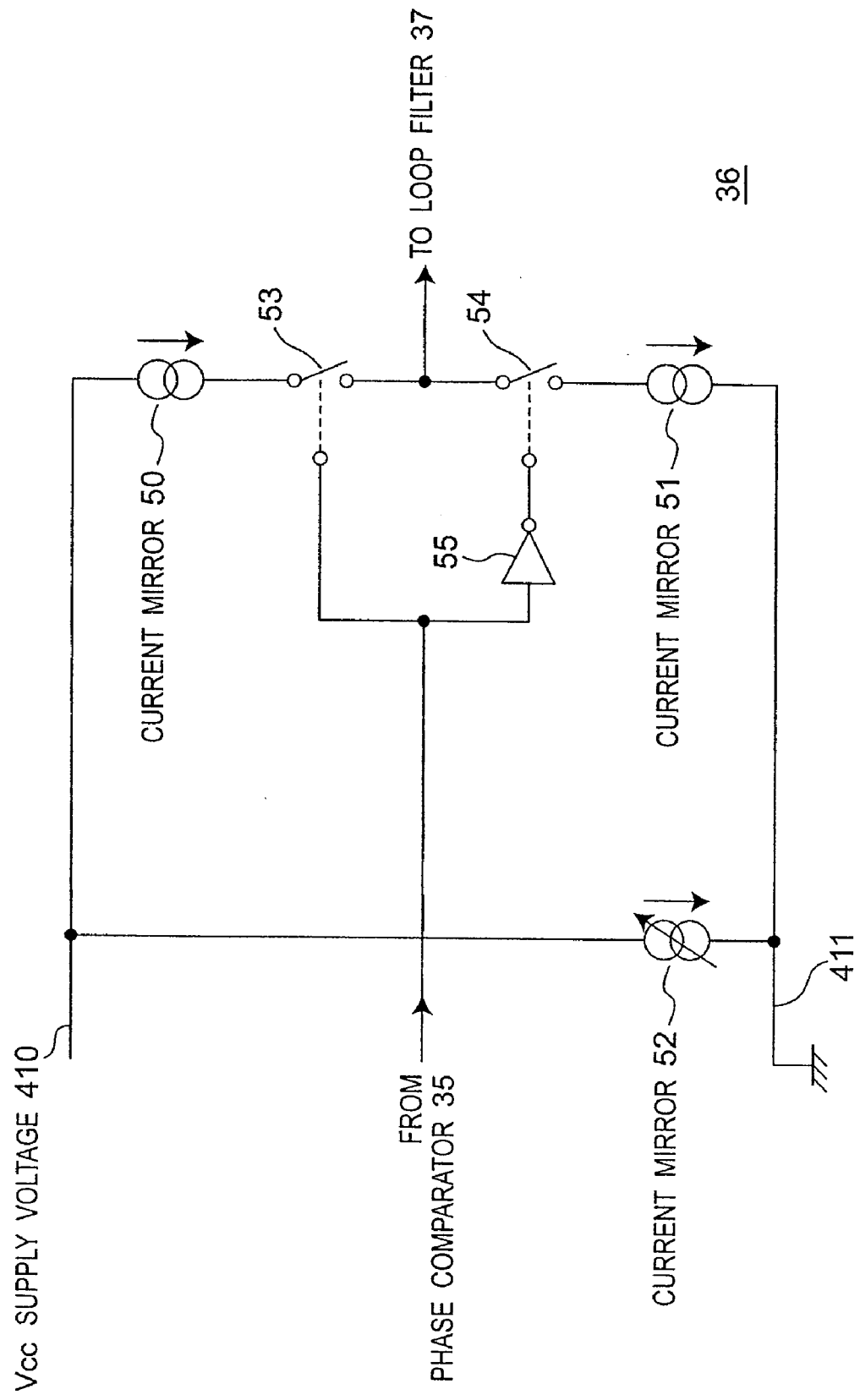
FIG. 18 is a circuit diagram of the charge pump in the second embodiment of the invention.

FIG. 18 is a circuit diagram of the charge pump in the second embodiment of the invention.

The current mirror unit 52 connected to Vcc supply voltage 410 and ground voltage 411, together with current mirror unit 50 and current mirror unit 51, constitute a current mirror circuit. Current of the same level flows to current mirror unit 50 and current mirror unit 51. This current level can be varied by adjusting the current of current mirror unit 52. The phase signal generated by phase comparator 35 is input to switch 53 and through inversion circuit 55 to switch 54. The phase signal from the phase comparator 35 causes switch 53 and switch 54 to turn on and off in a seesaw pattern, and the positive current from current mirror unit 50 and the negative current from current mirror unit 51 are alternately supplied to the loop filter 37.

Figure 19:
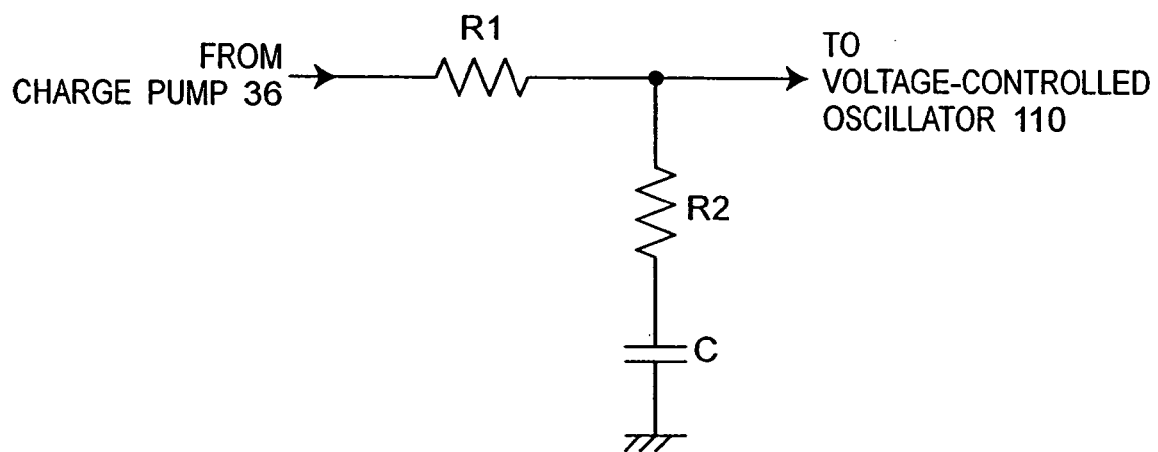
FIG. 19 is a circuit diagram of the loop filter in the second embodiment of the invention.
Figure 20:
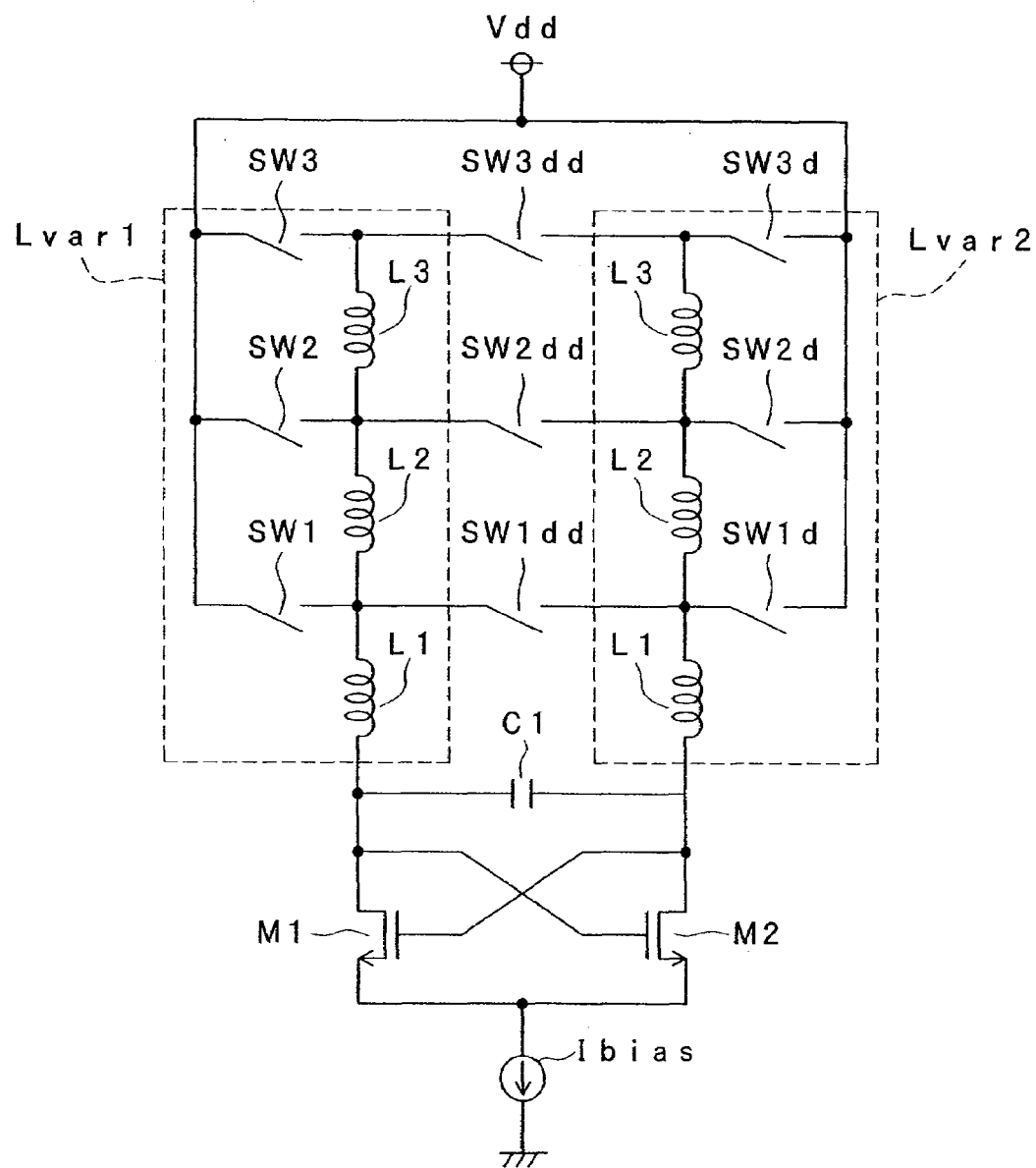
FIG. 20 is a block diagram of a voltage-controlled oscillator according to the prior art.

FIG. 19 is a circuit diagram of the loop filter in the second embodiment of the invention. High frequency distortion and noise are removed from the output of the charge pump 36 in FIG. 18 by the low-pass filter of the loop filter 37 comprising resistance R1, resistance R2, and capacitor C as shown in FIG. 19. The difference between the positive current and the negative current alternately supplied from the charge pump 36 is accumulated in capacitor C, converted to voltage, and supplied to the voltage-controlled oscillator 110.

The arrangement of the voltage-controlled oscillator 110 in FIG. 12 is as shown in FIG. 10. The nonlinearity of the varactor diode can be corrected, the temperature characteristic can be corrected, a direction modulation function is afforded, and a frequency band switching function is afforded by applying control signals such as the current amplitude control signal 300, capacitance control signal 302, frequency band signal 303, temperature characteristic signal 304, and frequency control signal 305.

Because the linearity of the voltage-controlled oscillator 110 in this PLL circuit is maintained over a wide frequency band, a direct modulation function can be achieved by applying the frequency control signal 305, and a high precision modulation signal is output as VCO signal 307. A mixer circuit is therefore unnecessary, and power consumption during transmission can be reduced.

First Variation of the Second Embodiment

FIG. 13 is a block diagram of a PLL circuit according to a first variation of the second embodiment.

The voltage-controlled oscillator 210 generates and outputs VCO signal 307, which is also 1/N frequency divided by 1/N frequency divider 32. The output of the reference signal oscillator 33 is 1/R frequency divided by 1/R frequency divider 34. The phase comparator 35 then compares the outputs from 1/N frequency divider 32 and 1/R frequency divider 34, and outputs the phase difference of the advance or delay in the input signals as the phase signal. Based on the sign of this phase difference, the charge pump 36 converts the phase signal to a positive or negative current. The loop filter 37 then converts the integral of this current to voltage, and removes high frequency distortion and noise. The output of loop filter 37 is input as capacitance control signal 302 to voltage-controlled oscillator 210, which generates the VCO signal 307 at an oscillation frequency determined by the capacitance control signal 302.

The phase comparator 35 is also referred to a phase generator herein.

The charge pump and loop filter are as shown by the circuit diagrams in FIG. 18 and FIG. 19, respectively, and operate to the same effect as described above.

The arrangement of the voltage-controlled oscillator 210 in FIG. 13 is as shown in FIG. 11. The nonlinearity of the varactor diode can be corrected, the temperature characteristic can be corrected, a direction modulation function is afforded, and a frequency band switching function is afforded by applying control signals such as the voltage-current conversion control signal 301, capacitance control signal 302, frequency band signal 303, temperature characteristic signal 304, and frequency control signal 305.

Because the linearity of the voltage-controlled oscillator 210 in this PLL circuit is maintained over a wide frequency band, a direct modulation function can be achieved by applying the frequency control signal 305, and a high precision modulation signal is output as VCO signal 307. A mixer circuit is therefore unnecessary, and power consumption during transmission can be reduced.

Second and Third Variations of the Second Embodiment

Figure 14:
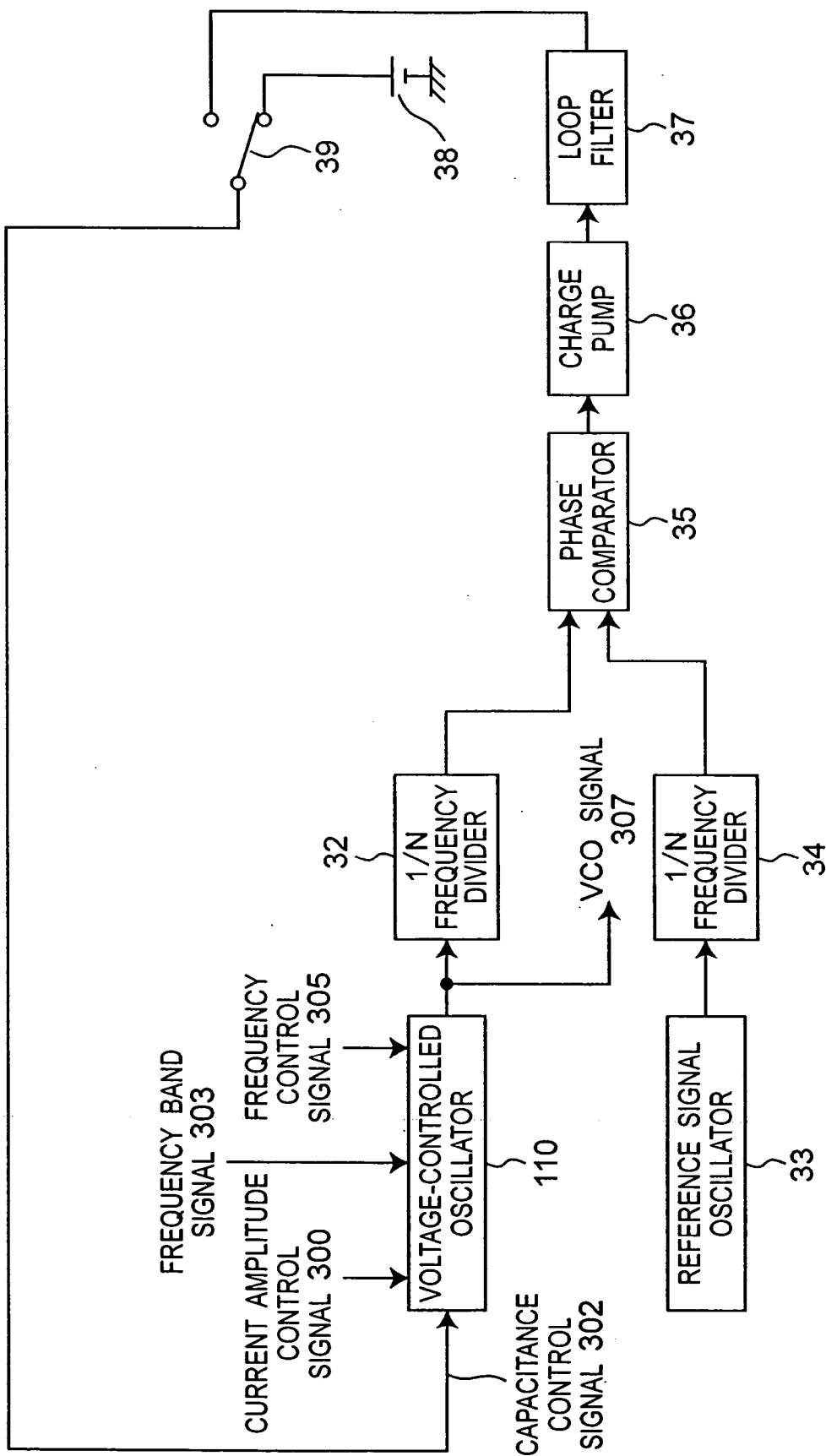
FIG. 14 is a block diagram of a PLL circuit according to a second variation of the second embodiment of the invention.

FIG. 14 is a block diagram of a PLL circuit according to a second variation of the second embodiment of the invention.

This PLL circuit differs from the PLL circuit shown in FIG. 12 in that the capacitance control signal 302 is not limited to the output signal from the loop filter 37. More particularly, a predetermined voltage source 38 can be selected by switch 39 as the capacitance control signal 302.

When the switch 39 switches to the voltage source 38, the PLL circuit is an open loop, and the capacitance control signal 302 is held to the specific voltage from the voltage-source 38. When the capacitance control signal 302 is fixed, the voltage-controlled oscillator 110 can be directly modulated according to the frequency control signal 305, and direct modulation oscillator that is unaffected by the frequency lock characteristic of the PLL circuit can be provided.

Figure 15:
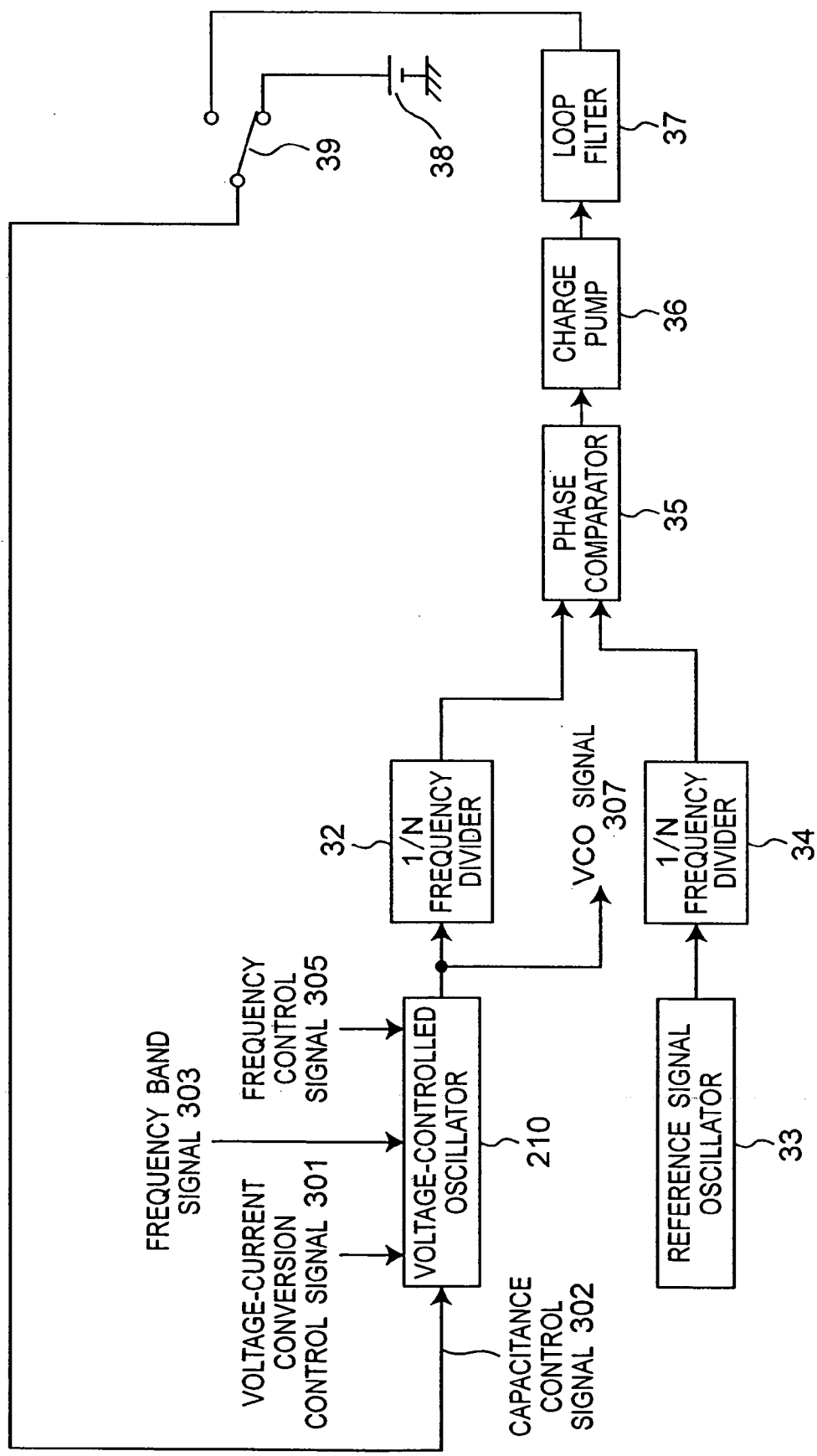
FIG. 15 is a block diagram of a PLL circuit according to a third variation of the second embodiment of the invention.

FIG. 15 is a block diagram of a PLL circuit according to a third variation of the second embodiment of the invention.

This PLL circuit differs from the PLL circuit shown in FIG. 13 in that the capacitance control signal 302 is not limited to the output signal from the loop filter 37. More particularly, a predetermined voltage source 38 can be selected by switch 39 as the capacitance control signal 302.

When the switch 39 switches to the voltage source 38, the PLL circuit is an open loop, and the capacitance control signal 302 is held to the specific voltage from the voltage source 38. When the capacitance control signal 302 is fixed, the voltage-controlled oscillator 210 can be directly modulated according to the frequency control signal 305, and direct modulation oscillator that is unaffected by the frequency lock characteristic of the PLL circuit can be provided.

Fourth and Fifth Variations of the Second Embodiment

Figure 16:
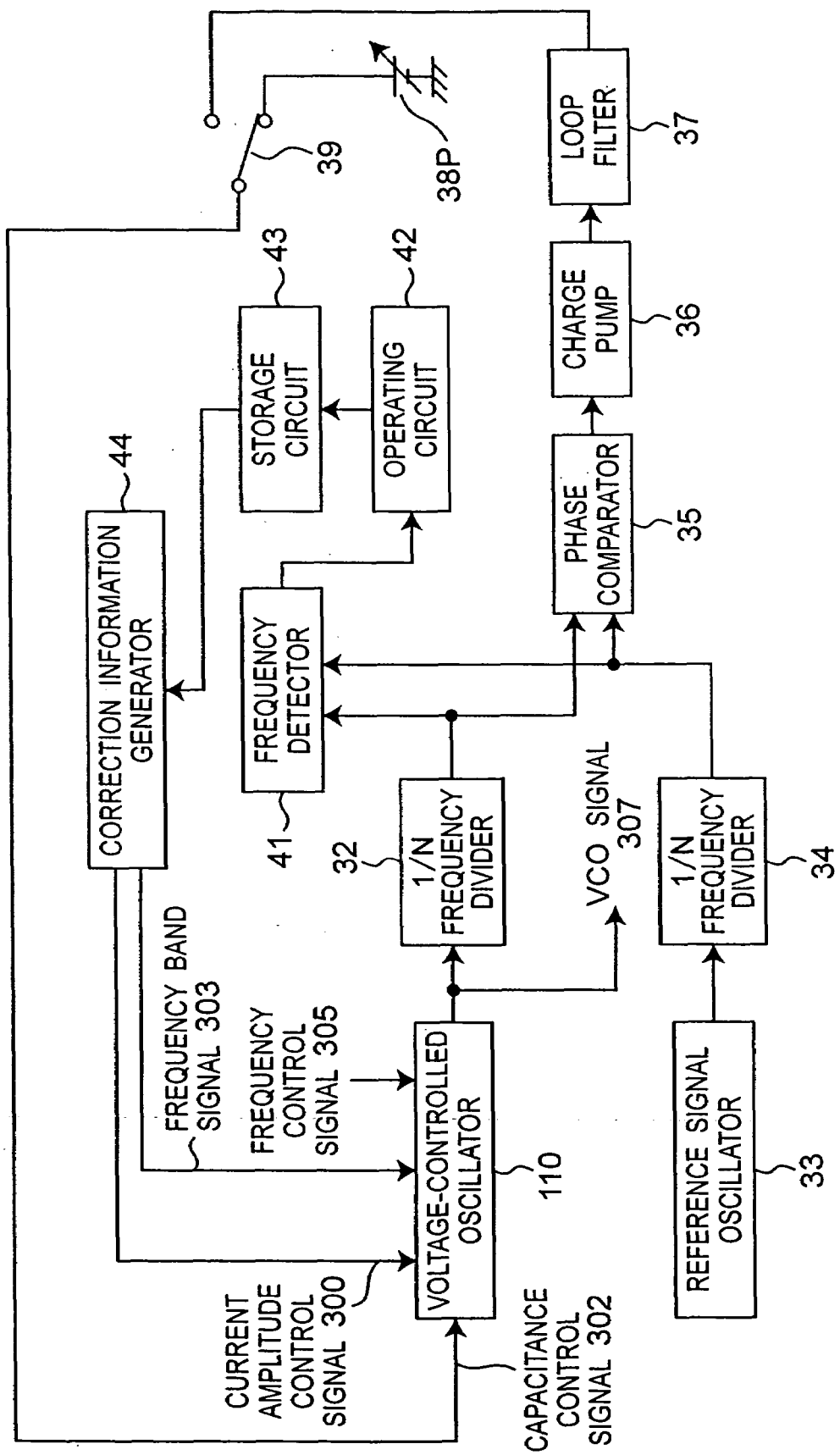
FIG. 16 is a block diagram of a PLL circuit according to a fourth variation of the second embodiment of the invention.

FIG. 16 is a block diagram of a PLL circuit according to a fourth variation of the second embodiment of the invention.

This PLL circuit differs from the PLL circuit shown in FIG. 14 in that various characteristics of the voltage-controlled oscillator 110 are measured in advance and based on the results of these measurements the characteristics are corrected by the control signals. These differences are further described below.

Switch 39 is first switched to the variable voltage source 38P side so that the PLL circuit is an open loop. The current amplitude control signal 300 and frequency band signal 303 are fixed to predetermined values, the current-amplitude ratio K1 is therefore also constant, and the inductance of the variable inductor unit 82 of the voltage-controlled oscillator 110 is thus fixed. If the voltage from the variable voltage source 38P changes in this state, the capacitance control signal 302 varies accordingly and the oscillation frequency of the voltage-controlled oscillator 110 thus varies.

The voltage-controlled oscillator 110 generates and outputs VCO signal 307, which is 1/N frequency divided by 1/N frequency divider 32 and input to frequency detector 41. The reference signal from the reference signal oscillator 33 is 1/R frequency divided by 1/R frequency divider 34 and input to frequency detector 41. The frequency detector 41 determines the frequency of the VCO signal 307 from the frequency difference of the VCO signal 307 to the reference signal. The operating circuit 42 measures the capacitance characteristic, frequency band characteristic, and temperature characteristic at the frequency of the VCO signal 307, and the resulting measurement data is stored in storage circuit 43.

The switch 39 then switches to the loop filter 37 side so that the PLL circuit is a closed loop. Based on the measurement data read from storage circuit 43, the correction information generator 44 generates the current amplitude control signal 300 and frequency band signal 303 causing the inductance L of the variable inductor unit 82 to go to L/(A1(VT)*A2(FB)*A3(TM)), and inputs the resulting current amplitude control signal 300 and frequency band signal 303 to the voltage-controlled oscillator 110.

The capacitance characteristic, frequency band characteristic, and temperature characteristic of the VCO signal 307 generated by the voltage-controlled oscillator 110 are thus corrected, and the conversion gain Kv is constant with respect to changes in the capacitance control signal 302. The lockup time and C/N characteristic of the PLL incorporating this voltage-controlled oscillator are also constant to the oscillation frequency, and a stable oscillation characteristic can be achieved. A high precision directly modulated oscillator can thus be achieved by applying the frequency control signal 305 to the voltage-controlled oscillator 110. A mixer circuit is therefore unnecessary, and power consumption during transmission can be reduced.

Figure 17:
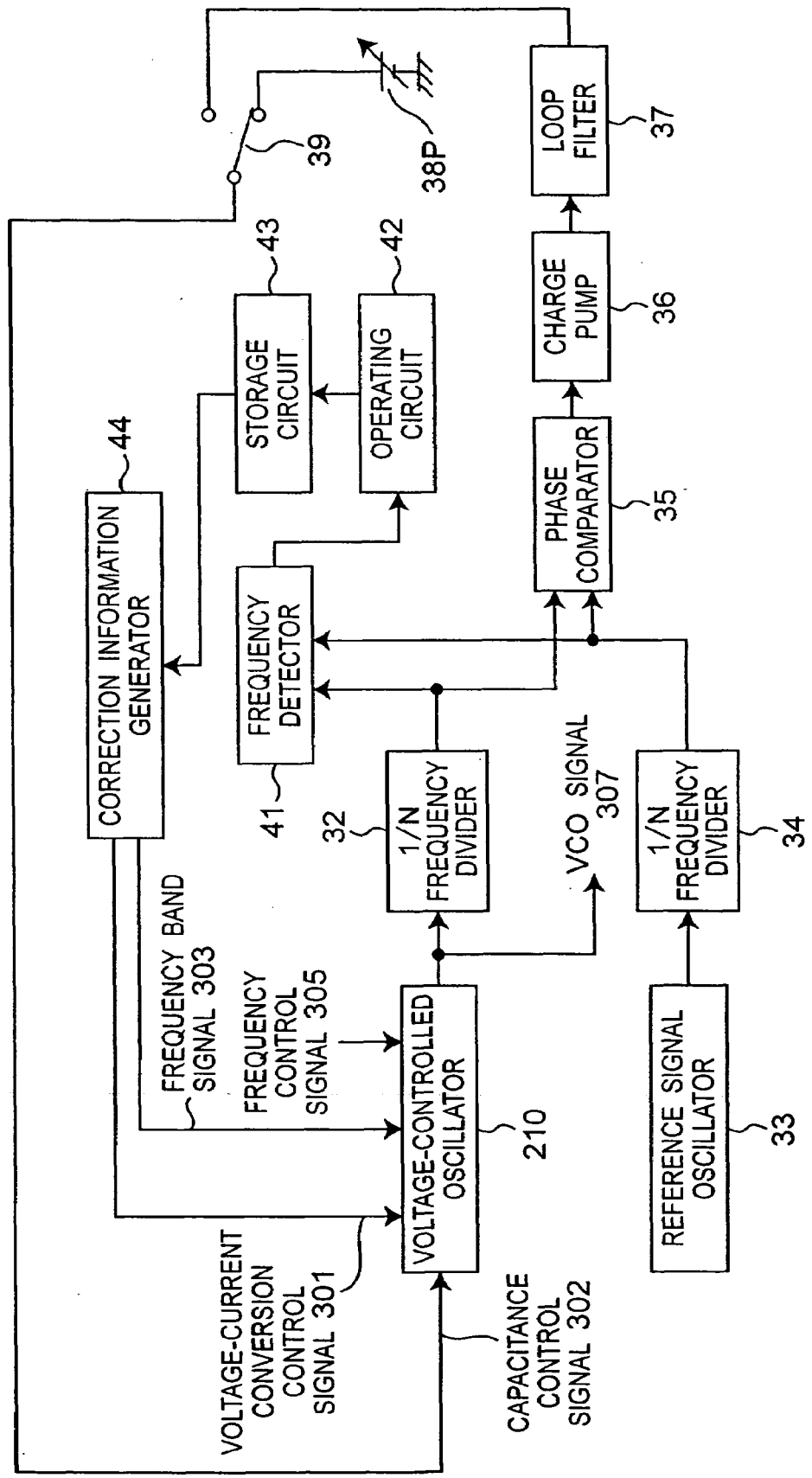
FIG. 17 is a block diagram of a PLL circuit according to a fifth variation of the second embodiment of the invention.

FIG. 17 is a block diagram of a PLL circuit according to a fifth variation of the second embodiment of the invention.

This PLL circuit differs from the PLL circuit shown in FIG. 15 in that various characteristics of the voltage-controlled oscillator 210 are measured in advance and based on the results of these measurements the characteristics are corrected by the control signals. These differences are further described below.

Switch 39 is first switched to the variable voltage source 38P side so that the PLL circuit is an open loop. The voltage-current conversion control signal 301 and frequency band signal 303 are fixed to predetermined values, the voltage-current conversion ratio K2 is therefore also constant, and the inductance of the variable inductor unit 83 of the voltage-controlled oscillator 110 is thus fixed. If the voltage from the variable voltage source 38P changes in this state, the capacitance control signal 302 varies accordingly and the oscillation frequency of the voltage-controlled oscillator 210 thus varies.

The voltage-controlled oscillator 210 generates and outputs VCO signal 307, which is 1/N frequency divided by 1/N frequency divider 32 and input to frequency detector 41. The reference signal from the reference signal oscillator 33 is 1/R frequency divided by 1/R frequency divider 34 and input to frequency detector 41. The frequency detector 41 determines the frequency of the VCO signal 307 from the frequency difference of the VCO signal 307 to the reference signal. The operating circuit 42 measures the capacitance characteristic, frequency band characteristic, and temperature characteristic at the frequency of the VCO signal 307, and the resulting measurement data is stored in storage circuit 43.

The switch 39 then switches to the loop filter 37 side so that the PLL circuit is a closed loop. Based on the measurement data read from storage circuit 43, the correction information generator 44 generates the voltage-current conversion control signal 301 and frequency band signal 303 causing the inductance L of the variable inductor unit 83 to go to L/(A1 (VT)*A2(FB)*A3(TM)), and inputs the resulting voltage-current conversion control signal 301 and frequency band signal 303 to the voltage-controlled oscillator 210.

The capacitance characteristic, frequency band characteristic, and temperature characteristic of the VCO signal 307 generated by the voltage-controlled oscillator 110 are thus corrected, and the conversion gain Kv is constant with respect to changes in the capacitance control signal 302. The lockup time and C/N characteristic of the PLL incorporating this voltage-controlled oscillator are also constant to the oscillation frequency, and a stable oscillation characteristic can be achieved. A high precision directly modulated oscillator can thus be achieved by applying the frequency control signal 305 to the voltage-controlled oscillator 210. A mixer circuit is therefore unnecessary, and power consumption during transmission can be reduced.

Effect of the Second Embodiment

The capacitance characteristic, frequency band characteristic, and temperature characteristic of the voltage-controlled oscillator 110, 210 are corrected, and a constant conversion gain Kv is achieved over a wide frequency band and temperature range. The lockup time and C/N characteristic of the PLL incorporating this voltage-controlled oscillator 110, 210 are also constant to the oscillation frequency, and a stable oscillation characteristic can be achieved.

A high precision directly modulated oscillator can thus be achieved by applying the frequency control signal 305 to the voltage-controlled oscillator 110, 210. A mixer circuit is therefore unnecessary, and power consumption during transmission can be reduced.

An oscillator according to the present invention and a PLL circuit comprising this oscillator can be used in communication modules using a wireless or wired communication path, to communication equipment incorporating such communication modules, to cell phones and other portable terminals incorporating this communication module and to portable communication systems comprising such portable terminals.

It will also be noted that the embodiments described above are used for illustration only, and the invention is not limited to these embodiments.

The present invention can be used in oscillators and in PLL circuits that use such an oscillator.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. An oscillator comprising:
   a variable inductor unit comprising
      a first inductor,
      a current signal generator operable to detect an electric signal denoting current flowing to the first inductor or the voltage at both ends of the first inductor, and to generate a current signal based on the electric signal, and
      a second inductor that receives the current signal,
      wherein the first inductor and second inductor are disposed to a predetermined magnetically coupled position, and the inductance of the first inductor is set desirably;
   a variable capacitance device connected to the variable inductor unit;
   an output unit that comprises one or more active elements, oscillates at an oscillation frequency determined by the inductance of the variable inductor unit and the capacitance of the variable capacitance device, and generates a VCO signal; and
   a control signal generator operable to generate a frequency control signal to modulate the oscillation frequency;
   wherein the current signal generator controls the amplitude of the current signal based on the frequency control signal.

2. The oscillator described in claim 1, further comprising one or more fixed capacitors that can be connected to a variable capacitance device;
   wherein the output unit outputs a signal that oscillates at an oscillation frequency determined by the inductance of the variable inductor unit and the capacitance of the variable capacitance device and fixed capacitor.

3. The oscillator described in claim 1, further comprising:
   an amplitude control signal generator operable to generate an amplitude control signal; and
   an amplitude control device operable to control the amplitude of the VCO signal based on the amplitude control signal.

4. The oscillator described in claim 1, further comprising:
   a current signal detection device operable to detect the amplitude of a current signal flowing to the second inductor; and
   a current source operable to supply current to the active element;
   wherein the current of the current source supplied to the active element is controlled based on the amplitude of the current signal detected by the current signal detection device.

5. The oscillator described in claim 1, further comprising:
   a control signal generator operable to generate a capacitance control signal controlling both end voltages of the variable capacitance device;
   a variable voltage source operable to set the capacitance control signal to a plurality of predetermined voltage levels;
   a frequency detection device operable to detect the frequency of the VCO signal at the plural predetermined voltage levels; and
   a correction information generating device operable to generate information operable to correct the inductance of the variable inductor unit based on the correlation between the plural predetermined voltage levels and frequency;

wherein the capacitance of the variable capacitance device varies based on the capacitance control signal, and the current signal is controlled based on the correction information.

6. A PLL circuit comprising:

an oscillator comprising a variable inductor unit of variable inductance, and a variable capacitance device connected to the variable inductor unit, the oscillator oscillating and generating a VCO signal of an oscillation frequency determined by the inductance of the variable inductor unit and the capacitance of the variable capacitance device;

a phase generator operable to generate a phase signal denoting the phase of the VCO signal; and a loop filter operable to filter the phase signal and to output a capacitance control signal;

wherein the variable inductor unit comprises
   a first inductor,
   a current signal generator operable to detect an electric signal denoting current flowing to the first inductor or the voltage at both ends of the first inductor, and to generate a current signal based on the electric signal, and
   a second inductor that receives the current signal,
   wherein the first inductor and second inductor are disposed to a predetermined magnetically coupled position, and the inductance of the first inductor is set desirably; and the oscillator controls both end voltages of the variable capacitance device based on the capacitance control signal, and sets the capacitance of the variable capacitance device to a desired level.

7. The PLL circuit described in claim 6, further comprising:

a control signal generator operable to generate a frequency control signal operable to modulate the oscillation frequency;

wherein the current signal generator controls the amplitude of the current signal based on the frequency control signal.

8. The PLL circuit described in claim 7, wherein the capacitance control signal is fixed to a predetermined value.

9. A communication module comprising the PLL circuit described in claim 6.

10. A communication device comprising the PLL circuit described in claim 6.

11. A mobile terminal comprising the PLL circuit described in claim 6.

12. A mobile communication system comprising:

the mobile terminal described in claim 11; and another mobile terminal that connects to the first mobile terminal.

\* \* \* \* \*